United States Patent

Aoai et al.

[11] Patent Number: 5,693,452
[45] Date of Patent: Dec. 2, 1997

[54] POSITIVE CHEMICALLY AMPLIFIED RESIST COMPOSITION

[75] Inventors: Toshiaki Aoai; Toru Fujimori, both of Shizuoka, Japan

[73] Assignee: Fuji Photo Film Co., Ltd., Kanagawa, Japan

[21] Appl. No.: 548,721

[22] Filed: Oct. 26, 1995

[30] Foreign Application Priority Data

Oct. 26, 1994 [JP] Japan ................. P.HEI 6-262790

[51] Int. Cl.⁶ ................................. G03F 7/004
[52] U.S. Cl. ............ 430/270.1; 430/176; 522/57; 522/59; 522/65
[58] Field of Search ................. 430/190, 191, 430/192, 193, 270.1, 176; 522/57, 59, 65

[56] References Cited

U.S. PATENT DOCUMENTS 5,403,695 4/1995 Hayase et al. .................. 430/192

FOREIGN PATENT DOCUMENTS

| A 02511887 | 1/1988 | European Pat. Off. |
| A 0541112 | 5/1993 | European Pat. Off. |
| A 4214363 | 11/1992 | Germany. |
| A 4405108 | 8/1994 | Germany. |
| 6-175359 | 6/1994 | Japan. |

*Primary Examiner*—Christopher G. Young
*Attorney, Agent, or Firm*—Sughrue, Mion, Zinn, Macpeak & Seas, PLLC

[57] ABSTRACT

A positive chemically amplified resist composition is disclosed, comprising (a) a compound which generates an acid upon irradiation with active light or radiant ray; (b) a resin insoluble in water but soluble in an aqueous alkali solution; and (c) a low molecular acid-decomposable dissolution inhibitor having a molecular weight of 3,000 or less and containing an acid-decomposable alkyl ester group represented by formula (I), and which increases its solubility in an alkali developer by the action of an acid, and having a sodium content and a potassium content each of 30 ppb or less. Also disclosed is a positive chemically amplified resist composition comprising the foregoing compound (a) and (d) a resin having an acid-decomposable alkyl ester group represented by formula (I), and which increases its solubility in an alkali developer by the action of an acid, and having a sodium content and a potassium content each of 30 ppb or less. Still further disclosed are methods for producing the compounds (c) and (d).

2 Claims, No Drawings

POSITIVE CHEMICALLY AMPLIFIED RESIST COMPOSITION

FIELD OF THE INVENTION

The present invention relates to a positive chemically amplified resist composition for use in the production of a semiconductor such as IC, in the production of a circuit board for a liquid crystal or a thermal head or in other photofabrication process and also relates to a method for producing materials contained in the composition.

BACKGROUND OF THE INVENTION

A composition containing an alkali-soluble resin and a naphthoquinone diazide compound as a photosensitive material is commonly used as a positive photoresist composition. For example, a "novolak-type phenol resin/naphthoquinone diazide-substituted compound" is described in U.S. Pat. Nos. 3,666,473, 4,115,128 and 4,173,470 and an example of "a novolak resin comprising cresol-formaldehyde/trihydroxybenzophenone-1,2-naphthoquinone diazide sulfonic ester" as the most representative composition is described in L. F. Thompson *Introduction to Microlithography*, ACS Shuppan, No. 2, Vol. 19, pp. 112–121.

In the positive photoresist basically comprising a novolak resin and a quinone diazide compound, the novolak resin provides high durability in plasma etching and the naphthoquinone diazide compound acts as a dissolution inhibitor. The naphthoquinone diazide has properties such that it generates a carboxylic acid upon light irradiation to lose the dissolution inhibiting ability and thereby increases the alkali solubility of the novolak resin.

From this point of view, a large number of positive photoresists containing a novolak resin and a naphthoquinone diazide-based photosensitive material have hitherto been developed and used in practice and they have succeeded in providing good results in the process when the line width is approximately from 0.8 to 2 μm.

However, the integrated circuit is more and more being intensified in the degree of integration and in the production of a semiconductor substrate for VLSI's (very large scale integrated circuits), an ultrafine pattern comprising lines having a width of a half micron or less has come into need to process. In order to achieve the resolving power thus required, the wavelength in the exposure apparatus for use in the photolithography is more and more shortened and at present, even far ultraviolet light or excimer laser light (e.g., XeCl, KrF, ArF) has now been taken into consideration.

However, if a conventional resist comprising novolak and a naphthoquinone diazide compound is used for pattern formation in the lithography using far ultraviolet light or excimer laser light, the light can hardly reach the resist bottom due to the strong absorption of the novolak and the naphthoquinone diazide in the far ultraviolet region and as a result, only a low-sensitive and tapered pattern can be obtained.

As a means to overcome such a problem, U.S. Pat. No. 4,491,628 and European Patent 249,139 describe a chemically amplified-type resist composition. The chemically amplified-type positive resist composition is a pattern-forming material which produces an acid in the exposed area upon irradiation with radiant ray such as far ultraviolet light and causes reaction using the acid as a catalyst thereby differentiating the solubilities of the part irradiated with radiant ray and the non-irradiated part in a developer to form a pattern on a substrate.

As such a composition, for example, a compound which generates an acid by photodecomposition is used in combination with an acetal or an O,N-acetal compound (JP-A-48-89003, the term "JP-A" as used herein means an "unexamined published Japanese patent application"), in combination with an orthoester or an amidoacetal compound (JP-A-51-120714), in combination with a polymer having an acetal or ketal group in the main chain (JP-A-53-133429), in combination with an enol ether compound (JP-A-55-12995), in combination with an N-acyliminocarbonic acid compound (JP-A-55-126236), in combination with a polymer having an orthoester group in the main chain (JP-A-56-17345), in combination with a tertiary alkyl ester compound (JP-A-60-3625), in combination with a silyl ester compound (JP-A-60-10247) or in combination with a silyl ether compound (JP-A-60-37549 and JP-A-60-121446). The quantum yield of these combinations exceeds 1 in principle and thus each shows high photosensitivity.

Similarly, as a system which is stable under aging at room temperature but decomposes under heating in the presence of an acid to become alkali-soluble, for example, a combination system of a compound which generates an acid upon exposure as described in JP-A-59-45439, JP-A-60-3625, JP-A-62-229242, JP-A-63-27829, JP-A-63-36240, JP-A-63-250642, *Polym. Eng. Sce.*, Vol. 23, p. 1012 (1983); *ACS Sym.*, Vol. 242, p. 11 (1984); *Semiconductor World*, p. 91 (November, 1987); *Macromolecules*, Vol. 21, p. 1475 (1988); SPIE, Vol. 920, p. 42 (1988) with an ester of tertiary or secondary carbon (e.g., t-butyl, 2-cyclohexenyl) or with a carbonic acid ester compound may be used. This system also has high sensitivity and shows low absorption in the deep-UV region as compared with the naphthoquinone diazide/novolak resin system, thus it can be used as an effective system in the trend for shortening the wavelength of a light source.

Among these, in particular, a system using a resin or compound having an acid-decomposable ester group represented by formula (I) shown below provides a large effect on the acceleration of dissolution in an alkaline developer after acid decomposition and is expected to be an effective system. JP-A-5-181279, JP-A-6-51519, JP-A-6-83059, JP-A-6-167811, JP-A-6-194840 and JP-A-6-230572 describe on such a system.

The above-described positive chemically amplified-type resist can be roughly classified into a three-component system comprising an alkali-soluble resin, a compound which generates an acid upon exposure to radiant ray (photo acid generator) and a dissolution inhibitive compound which becomes alkali-soluble upon catalyst reaction with an acid (acid-decomposable dissolution inhibitor) and a two-component system comprising a resin having a group which becomes alkali-soluble upon reaction with an acid and a photo acid generator.

In the two-component system chemically amplified-type positive resist (as described in U.S. Pat. No. 4,491,628), the alkali-solubility of the alkali-soluble binder is reduced by protecting the alkali-soluble group of the binder mainly with an acid-decomposable group.

In the three-component system chemically amplified-type positive resist (as described in European Patent 249139 and JP-A-2-248953), the acid-decomposable dissolution inhibitor itself is alkali-insoluble and at the same time, interacts with a binder resin to reduce the alkali-solubility of the binder resin.

In this way, the two-component system and the three-component system are considered to differ in the mechanism for exerting the alkali dissolution inhibiting ability.

Also, to cope with the trend for high-density integrated circuit and in view of improvement in the yield in the production process of a semiconductor, it has been demanded to further reduce the metal impurities content in the chemical amplification-type resist composition. In case of a chemical amplification resist, it is an object to reduce the total content of metal impurities to 30 ppb or less calculated in terms of a simple substance. JP-A-6-175359 reports that the increase in the amount of metal impurities causes reduction in the resist sensitivity.

As a method for reducing the metal impurities in the resist composition, washing with an acidic aqueous solution or treatment with an acidic ion exchange resin or chelate resin is known but in case of a positive chemically amplified-type resist, a problem arises with respect to the maintenance of stability during the processing because the resist contains an acid-decomposable compound. On the other hand, an alkyl ester group represented by formula (I) below has been introduced into a low molecular compound or resin by condensation reaction with a compound represented by a formula (II) below in the presence of an inorganic base such as potassium carbonate or sodium carbonate as described in the synthesis examples of JP-A-5- 81279, JP-A-6-51519, JP-A-6-83059, JP-A-6-167811, JP-A-6-94840 and JP-A-6-230572. This is because the condensation reaction cannot proceed effectively if a normal organic amine base such as triethylamine or dimethylaminopyridine is used. However, the use of an inorganic base as mentioned above causes a problem of adulteration with metal impurities such as potassium or sodium.

SUMMARY OF THE INVENTION

Accordingly, an object of the present invention is to provide a positive chemically amplified resist using a low molecular compound or resin having an acid-decomposable alkyl ester group, and containing a less amount of metal impurities such as sodium and potassium.

Another object of the present invention is to provide a method for producing a low molecular compound or resin having an acid-decomposable alkyl ester group for use in the above-described resist composition in which adulteration with metal impurities such as sodium and potassium is prevented.

Accordingly, the present invention provides a positive chemically amplified resist composition comprising:

(a) a compound which generates an acid upon irradiation with active light or radiant ray;

(b) a resin insoluble in water but soluble in an aqueous alkali solution; and (c) a low molecular acid-decomposable dissolution inhibitor having a molecular weight of 3,000 or less and containing an acid-decomposable alkyl ester group represented by formula (I), and which increases its solubility in an alkali developer by the action of an acid:

wherein $R_{01}$ and $R_{02}$ each represents a hydrogen atom, or an alkyl group or an aryl group each of which may have a substituent; $R_{03}$, $R_{04}$ and $R_{05}$ each represents a hydrogen atom, or an alkyl group, a cycloalkyl group, an alkoxy group, an aryl group, an alkenyl group or an aralkyl group each of which may have a substituent, provided that two of $R_{03}$, $R_{04}$ and $R_{05}$ may be combined to form a ring; and n represents an integer of from 1 to 10, and having a sodium content and a potassium content each of 30 ppb or less.

Also, the present invention provides a positive chemically amplified resist composition comprising: (a) a compound which generates an acid upon irradiation with active light or radiant ray and (d) a resin which has an acid-decomposable alkyl ester group represented by formula (I), and which increases its solubility in an alkali developer by the action of an acid, and having a sodium content and a potassium content each of 30 ppb or less.

Further, the present invention provides the above-described positive chemically amplified resist composition comprising the compound (a), the resin (b) and the compound (c), wherein the compound (c) is a compound obtained by a deoxidation-condensation reaction of a low molecular compound having a phenolic hydroxyl group or a carboxyl group with a compound represented by formula (II) in the presence of an ammonium hydroxide represented by formula (III):

wherein $R_{01}$, $R_{02}$, $R_{03}$, $R_{04}$ and $R_{05}$ each has the same meaning as defined in formula (I); X represents a chlorine atom, a bromine atom, an iodine atom, an oxysulfonyl group; and $R_{06}$, $R_{07}$, $R_{08}$ and $R_{09}$ each represents a hydrogen atom, or an alkyl group, a cycloalkyl group, an aralkyl group, an alkenyl group or an aryl group each of which may have a substituent, provided that two of $R_{03}$, $R_{04}$ and $R_{05}$ or two of $R_{06}$, $R_{07}$, $R_{08}$ and $R_{09}$ may be combined to form a ring.

Furthermore, the present invention provides the above-described positive chemically amplified resist composition comprising the compound (a) and the resin (d), wherein the resin (d) is a resin obtained by a deoxidation condensation reaction of a resin having a phenolic hydroxyl group or a carboxyl group with a compound represented by formula (II) in the presence of an ammonium hydroxide represented by formula (III).

The present invention also provides a method for producing the compound (c) comprising deoxidation-condensing a low molecular compound having a phenolic hydroxyl group or a carboxyl group with a compound represented by formula (II) in an aprotic solvent in the presence of an ammonium hydroxide represented by formula (III) under heating.

Further, the present invention provides a method for producing the resin (d) comprising deoxidation-condensing a resin having a phenolic hydroxyl group or a carboxyl group with a compound represented by formula (II) in an aprotic solvent in the presence of an ammonium hydroxide represented by formula (III) under heating.

DETAILED DESCRIPTION OF THE INVENTION

In formulae (I), (II) and (III), $R_{01}$ and $R_{02}$ each represents a hydrogen atom, or an alkyl group or an aryl group each of which may have a substituent, preferably a hydrogen atom, an alkyl group having from 1 to 6 carbon atoms such as a methyl group, an ethyl group, a propyl group, an n-butyl group or an n-hexyl group, or an aryl group having from 6 to 10 carbon atoms such as a phenyl group, trityl group or a naphthyl group, more preferably a hydrogen atom, a methyl group or a phenyl group. $R_{03}$, $R_{04}$ and $R_{05}$ each represents a hydrogen atom, or an alkyl group, a cycloalkyl group, an alkoxy group, an aryloxy group, an aryl group, an alkenyl group or an aralkyl group each of which may have a substituent, preferably a hydrogen atom, the alkyl group as described above, a cycloalkyl group having from 3 to 10 carbon atoms such as a cyclopropyl group, a cyclopentyl group, a cyclohexyl group or an adamantyl group, an alkoxy group having from 1 to 4 carbon atoms such as a methoxy group, an ethoxy group, a propoxy group, an n-butoxy group or a 2-methoxyethoxy group, an aryloxy group having from 6 to 9 carbon atoms such as a phenoxy group or a tolyloxy group, the aryl group as described above, an alkenyl group having from 2 to 4 carbon atoms such as a vinyl group, a propenyl group, an allyl group or butenyl group, or an aralkyl group having from 7 to 10 carbon atoms such as a benzyl group or a tolylmethyl group, more preferably a hydrogen atom, a methyl group, an ethyl group, a cyclopropyl group, a methoxy group, an ethoxy group, a phenyl group or a tolyl group. Two of $R_{03}$, $R_{04}$ and $R_{05}$ may be combined to form a 3-, 4-, 5- or 6-membered ring such as cyclopropyl, cyclopentyl, cyclopentenyl, cyclohexyl or cyclohexenyl.

$R_{06}$, $R_{07}$, $R_{08}$ and $R_{09}$ each represents a hydrogen atom or an alkyl group, a cycloalkyl group, an aralkyl group, an alkenyl group or an aryl group each of which may have a substituent, preferably a hydrogen atom, the alkyl group as described above, the cycloalkyl group as described above, the aralkyl group as described above, the alkenyl group as described above or the aryl group as described above, more preferably a hydrogen atom, a methyl group, an ethyl group, a propyl group, an n-butyl group, a benzyl group or a phenyl group. Two of $R_{06}$, $R_{07}$, $R_{08}$ and $R_{09}$ may be combined to form a 5-, 6-, 7- or 8-membered ring. X represents a chlorine atom, a bromine atom, an iodine atom or an oxysulfonyl group (e.g., tosylate, mesylate), preferably a chlorine atom or a bromine atom. n represents an integer of from 1 to 10, preferably from 1 to 4.

Preferred examples of the substituent include the alkyl group as described above, the alkoxy group as described above, a halogen atom, an amino group, a hydroxyl group, an ammonium group, a cyano group, a nitro group, a carboxyl group and an alkoxycarbonyl group.

The resist composition of the present invention has a sodium content and a potassium content each of 30 ppb or less. The metal impurities content as law as this level has attained by the presence of an ammonium hydroxide represented by formula (III) which causes an efficient condensation reaction of a compound represented by formula (II) with a compound or resin having —OH group or —COOH group, even in the absence of sodium carbonate or potassium carbonate which has hitherto been used as a catalyst. The condensation reaction is considered to proceed efficiently because the ammonium hydroxide represented by formula (III) brings about a reaction mechanism different from that brought about by the aforementioned organic amine base such as triethylamine or dimethylaminopyridine.

In the three-component positive photosensitive composition of the present invention, an acid-decomposable dissolution inhibitor increases its dissolution inhibiting property when the acid-decomposable dissolution inhibitor has a structure wherein the acid-decomposable groups exist at a certain distance or longer.

Further, although the dissolution inhibiting efficiency is generally reduced in case where a poly(p-hydroxystyrene) resin is used as an alkali-soluble resin because of its high alkali dissolution rate, a sufficient dissolution inhibiting property can be exhibited by using the above-described acid-decomposable dissolution inhibitor in combination.

Furthermore, the dissolution inhibitive compound or resin having an acid-decomposable group may undergo large reduction in the heat decomposition temperature depending on the kind of the acid-decomposable group. However, when the alkyl ester group of the present invention is used as the acid-decomposable group, the heat decomposition temperature can be kept high (for example, at about 160° C. in case of a t-butyl ester form). The dissolution inhibitor having a t-butyl ester group shows a good solubility in a resist solvent even if the t-butyl ester group is incorporated in a large amount.

The compounds for use in the present invention and the method of the present invention are described below in detail.

(A) Acid-decomposable dissolution inhibitor (compound (c) of the present invention)

The acid-decomposable dissolution inhibitor used as compound (c) of the present invention has a structure in which at least two alkyl ester groups represented by formula (I) are contained and the longest distance between the ester moieties (i.e., —COO—C($R_{03}$)($R_{04}$)($R_{05}$)) of formula (I) is interposed by at least 8, preferably at least 10, more preferably at least 14 bonding atoms excluding the ester moieties or in which at least three alkyl ester groups represented by formula (I) are contained and the longest distance between the ester moieties is interposed by at least 7, preferably 9, more preferably 13 bonding atoms excluding the ester moieties.

In the present invention, when the acid-decomposable dissolution inhibitor (c) has three or more, preferably four or more alkyl ester groups represented by formula (I) or two alkyl ester groups with the alkyl ester groups being remote at the predetermined distance, the dissolution inhibiting property for the alkali-soluble resin is remarkably improved.

The distance between the ester moieties of the present invention is expressed by the number of bonding atoms intervening therebetween excluding the ester moieties. For example, in the case of Compound (1) shown below, the distance between the ester moieties is 8 bonding atoms, in the case of Compound (2), 4 bonding atoms, and in the case of Compound (3), 16 bonding atoms.

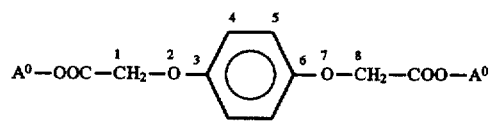

(1)

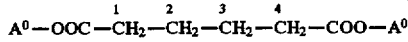

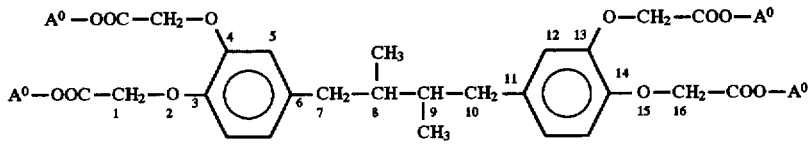

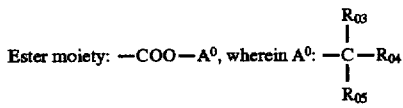

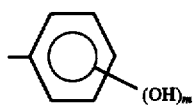
Ester moiety: —COO—A⁰, wherein A⁰: 

In the present invention, the compound (c) is preferably a compound wherein an alkali-soluble group is intentionally remained at a proportion of at least 10 mol%, preferably 30 mol%, more preferably 50 mol% of the total content of the compound (c).

The content of the alkali-soluble group can be expressed by NS/(NB+NS), wherein NS is an average number of the alkali-soluble groups in the dissolution inhibitor containing the alkyl ester groups represented by formula (I) and NB is an average number of the alkyl ester groups. The content of the alkali-soluble group is preferably 0.01≦NS/(NB+NS)≦0.75, more preferably 0.1≦NS/(NB+NS)≦0.5. Particularly preferred is the case where constitutional components having a ratio of the number of alkali-soluble groups (N1S) to the alkyl ester groups (N1B) per one molecule of the dissolution inhibitor satisfying 0.1≦N1S/(N1B+N1S)≦0.5 are contained in an amount of 50% by weight or more of the total weight of the dissolution inhibitor.

To exhibit the function of the alkali-soluble group by a developer which will be described later, the alkali-soluble group to be protected by an acid-decomposable group and the alkali-soluble group to be remained are preferably a group having a pKa of 12 or less. Preferred examples of the alkali-soluble group include a group having a phenolic hydroxyl group, a carboxylic acid group, an imido group, an N-hydroxyimido group, an N-sulfonylamido group, a sulfonamido group, an N-sulfonylurethane group, an N-sulfonylureido group or an active methylene group. Specific examples thereof include the followings:

—COOH, —SO₃H, —SO₂H,

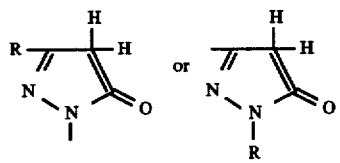

(m: an integer of from 1 to 5), —COCH₂COR, —CONHSO₂R, —SO₂NHR, —SO₂NHCONHR, —SO₃NHCOOR, —NHSO₂NHCOR,

(R: an alkyl group or an aryl group)

These groups may be incorporated in combination in one molecule. The alkali-soluble group is by no means limited to these specific examples.

The dissolution inhibitor containing an alkyl ester group represented by formula (I) may have the alkyl ester groups in plurality on one benzene ring but preferably it is a compound constituted by a skeleton having one alkyl ester group on one benzene ring. The alkyl ester group-containing dissolution inhibitor of the present invention has a molecular weight of 3,000 or less, preferably from 500 to 3,000, more preferably from 1,000 to 2,500.

The ester moiety (—COO—C(R₀₃)(R₀₄)(R₀₅)) in the alkyl ester group represented by formula (I) is preferably a t-butyl ester group, a t-pentyl ester group, a t-hexyl ester group, a 1-cyclohexenyl ester group, a 2-cyclopropyl-2-propyl ester group, a 2-phenyl-2-propyl group, a 1-methoxyethyl ester group or a tetrahydropyranyl ester group, more preferably a t-butyl ester group.

Other preferred examples thereof include compounds obtained by the deoxidation-condensation reaction of a part or whole of phenolic OH groups of a polyhydroxy compound as described in JP-A-1-289946, JP-A-1-289947, JP-A-2-2560, JP-A-3-128959, JP-A-3-158855, JP-A-3-179353, JP-A-3-191351, JP-A-3-200251, JP-A-3-200252, JP-A-3-200253, JP-A-3-200254, JP-A-3-200255, JP-A-3-259149, JP-A-3-279958, JP-A-3-279959, JP-A-4-1650, JP-A-4-1651, JP-A-4-11260, JP-A-4-12356, JP-A-4-12357, JP-A-4-271349, JP-A-5-45869, JP-A-5-158233, JP-A-5-224409, JP-A-5-257275, JP-A-5-297581, JP-A-5-297583, JP-A-5-309197 or JP-A-5-303200 with a compound represented by formula (II) in the presence of a compound represented by formula (III).

More preferred examples thereof include those using a polyhydroxy compound described in JP-A-1-289946, JP-A-3-128959, JP-A-3-158855, JP-A-3-179353, JP-A-3-200251, JP-A-3-200252, JP-A-3-200255, JP-A-3-259149, JP-A-3-279958, JP-A-4-1650, JP-A-4-11260, JP-A-4-12356, JP-A-4-12357, JP-A-5-224409, JP-A-5-297581, JP-A-5-297583, JP-A-5-309197 and JP-A-5-303200.

Specific examples thereof include the compounds represented by formulae (IV) to (XIX).

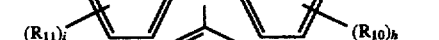

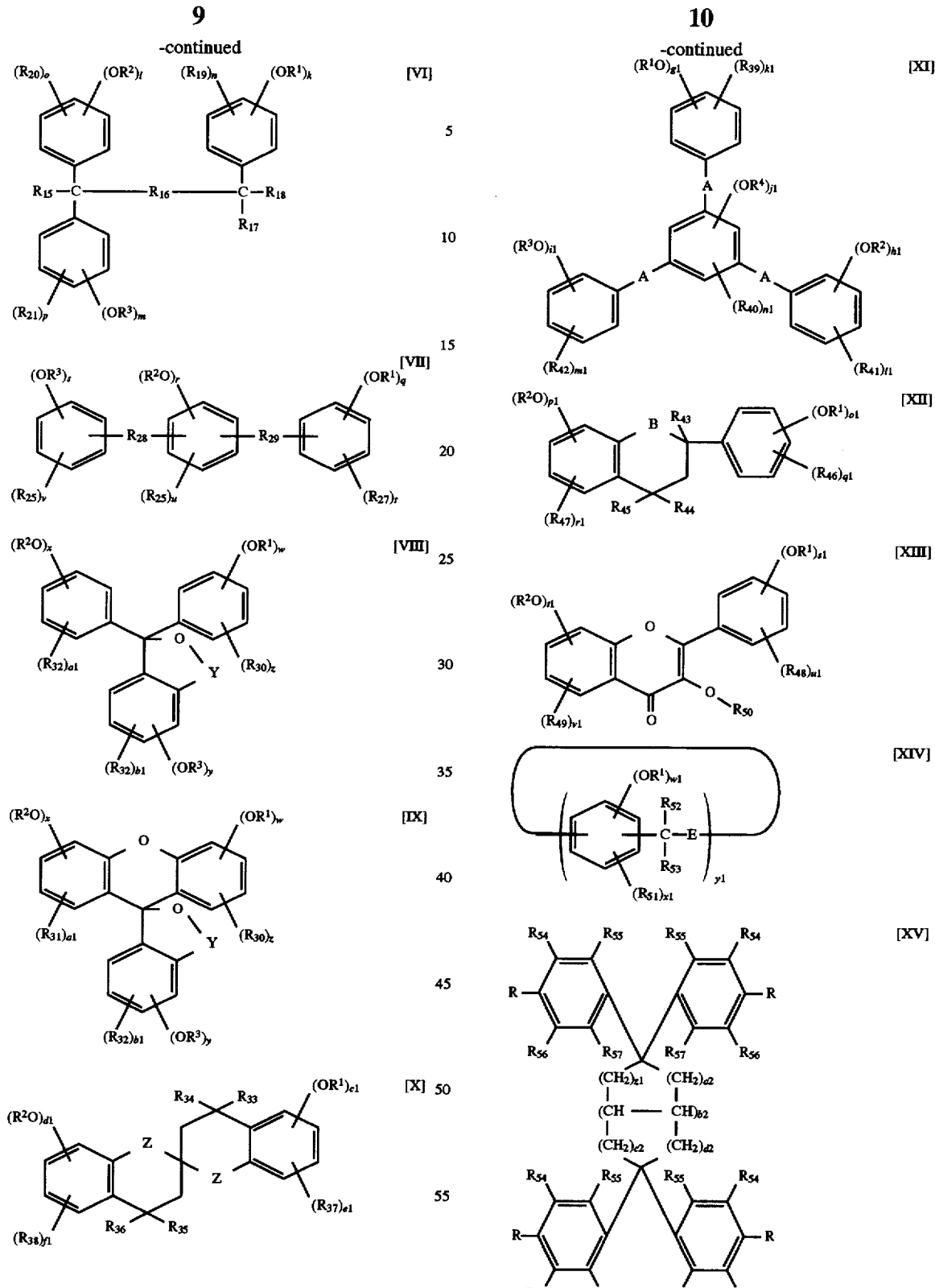
wherein $R^1$, $R^2$, $R^3$ and $R^4$, which may be the same or different, each represents a hydrogen atom or —$C(R_{01})(R_{02})$—COO—$C(R_{03})(R_{04})(R_{05})$;
$R_1$ represents —CO—, —COO—, —NHCONH—, —NHCOO—, —O—, —S—, —SO—, —SO$_2$—, —SO$_3$— or

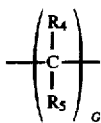

(wherein G is from 2 to 6, provided that when G is 2, at least one of $R_4$ and $R_5$ is an alkyl group, and $R_4$ and $R_5$, which may be the same or different, each represents a hydrogen atom, an alkyl group, an alkoxy group, —OH, —COOH, —CN, a halogen atom, —$R_6$—COO$R_7$ or —$R_8$—OH (wherein $R_6$ and $R_8$ each represents an alkylene group and $R_7$ represents a hydrogen atom, an alkyl group, an aryl group or an aralkyl group));

$R_2$, $R_3$, $R_9$ to $R_{12}$, $R_{15}$, $R_{17}$ to $R_{21}$, $R_{25}$ to $R_{27}$, $R_{30}$ to $R_{32}$, $R_{37}$ to $R_{42}$, $R_{46}$ to $R_{49}$ and $R_{51}$, which may be the same or different, each represents a hydrogen atom, a hydroxyl group, an alkyl group, an alkoxy group, an acyl group, an acyloxy group, an aryl group, an aryloxy group, an aralkyl group, an aralkyloxy group, a halogen atom, a nitro group, a carboxyl group, a cyano group or —N($R_{13}$)($R_{14}$) (wherein $R_{13}$ and $R_{14}$ each represents a hydrogen atom, an alkyl group or an aryl group);

$R_{16}$ represents a single bond, an alkylene group or

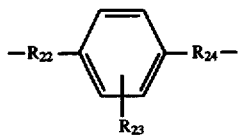

$R_{22}$ and $R_{24}$, which may be the same or different, each represents a single bond, an alkylene group, —O—, —S—, —CO— or a carboxyl group and $R_{23}$ represents a hydrogen atom, an alkyl group, an alkoxy group, an acyl group, an acyloxy group, an aryl group, a nitro group, a hydroxyl group, a cyano group or a carboxyl group);

$R_{28}$ and $R_{29}$, which may be the same or different, each represents a methylene group, a lower alkyl-substituted methylene group, a halomethylene group or a haloalkyl group;

$R_{33}$ to $R_{36}$, which may be the same or different, each represents a hydrogen atom or an alkyl group;

$R_{43}$ to $R_{45}$, which may be the same or different, each represents a hydrogen atom, an alkyl group, an alkoxy group, an acyl group or an acyloxy group;

$R_{50}$ represents a hydrogen atom or

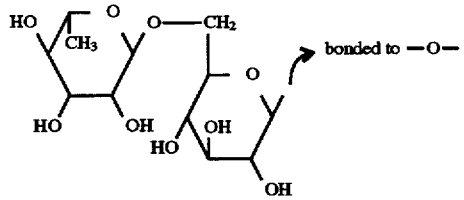

$R_{52}$ and $R_{53}$, which may be the same or different, each represents a hydrogen atom, a lower alkyl group, a lower haloalkyl group or an aryl group;

$R_{54}$ to $R_{57}$, which may be the same or different, each represents a hydrogen atom, a hydroxyl group, a halogen atom, a nitro group, a cyano group, a carbonyl group, an alkyl group, an alkoxy group, an alkoxycarbonyl group, an aralkyl group, an aralkyloxy group, an acyl group, an acyloxy group, an alkenyl group, an alkenyloxy group, an aryl group, an aryloxy group or an aryloxycarbonyl group, provided that four substituents represented by the same symbol may not be the same group;

Y represents —CO— or —$SO_2$—;

Z and B each represents a single bond or —O—;

A represents a methylene group, a lower alkyl-substituted methylene group, a halomethylene group or a haloalkyl group;

E represents a single bond or an oxymethylene group;

the groups in the parenthesis may be the same or different when a to z and a1 to y1 each represents a plural number;

a to q, s, t, v, g1 to i1, k1 to m1, o1, q1, s1 and u1 each represents 0 or an integer of from 1 to 5;

r, u, w, x, y, z, a1 to f1, p1, r1, t1 and v1 to x1 each represents 0 or an integer of from 1 to 4;

j1, n1, z1, a2, b2, c2 and d2 each represents 0 or an integer of from 1 to 3;

at least one of z1, a2, c2 and d2 represents 1 or more;

y1 represents an integer of from 3 to 8;

(a+b), (e+f+g), (k+l+m), (q+r+s), (w+x+y), (c1+d1), (g1+h1+i1+j1), (o1+p1), (s1+t1)≧2;

(j1+n1)≧3;

(r+u), (w+z), (x+a1), (y+b1), (c1+e1), (d1+f1), (p1+r1), (t1+v1), (x1+w1)≦4, provided that in formula (VIII), (w+z), (x+a1)≦5; and (a+c), (b+d), (e+h), (f+i), (g+j), (k+n), (l+o), (m+p), (q+t), (s+v), (g1+k1), (h1+l1), (i1+m1), (o1+q1), (s1+u1)≦5.

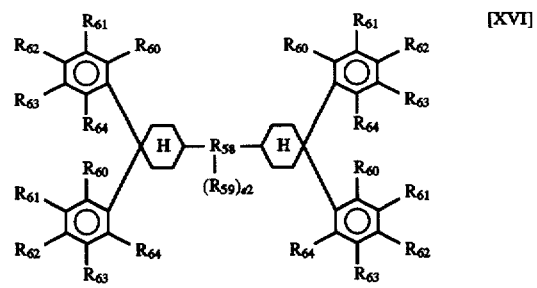

[XVI]

wherein $R_{58}$ represents an organic group, a single bond, —S—,

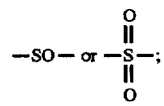

$R_{59}$ represents a hydrogen atom, a monovalent organic group or

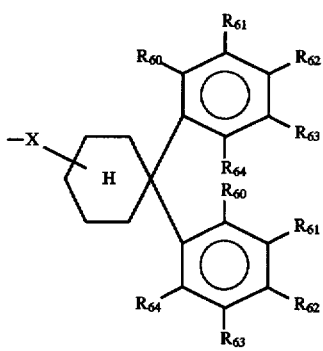

(wherein $R_{60}$ to $R_{64}$, which may be the same or different, each represents a hydrogen atom, a hydroxyl group, a halogen atom, an alkyl group, an alkoxy group, an alkenyl group or an —O—C($R_{O1}$)($R_{O2}$)—COO—C($R_{O3}$)($R_{O4}$)($R_{O5}$) group, provided that at least two of $R_{60}$ to $R_{64}$ are an —O—C($R_{O1}$)($R_{O2}$)—COO—C($R_{O3}$)($R_{O4}$)($R_{O5}$) group and four, five or six substituents represented by the same symbol may not be the same group, and X represents a divalent organic group); and e2 represents 0 or 1.

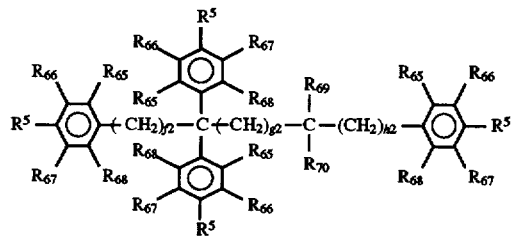

[XVII]

wherein $R_{65}$ to $R_{68}$, which may be the same or different, each represents a hydrogen atom, a hydroxyl group, a halogen atom, an alkyl group, an alkoxy group or an alkenyl group, provided that four, five or six substituents represented by the same symbol may not be the same group;

$R_{69}$ and $R_{70}$ each represents a hydrogen atom, an alkyl group or

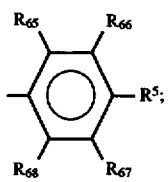

at least two $R^5$ groups represent an —O—C($R_{O1}$)($R_{O2}$)—COO—C($R_{O3}$)($R_{O4}$)($R_{O5}$) group and the rest(s) is/are a hydrogen atom or a hydroxyl group; and f2, g2 and h2 each represents 0 or an integer of from 1 to 5.

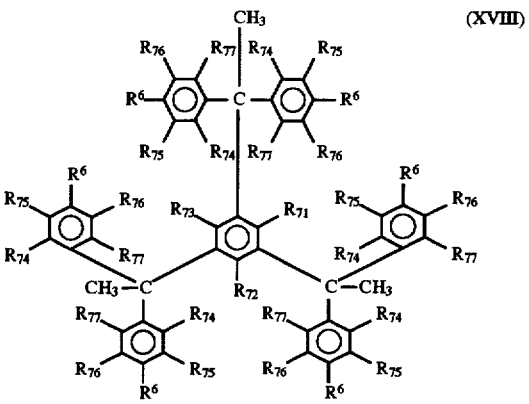

(XVIII)

wherein $R_{71}$ to $R_{77}$, which may be the same or different, each represents a hydrogen atom, a hydroxyl group, a halogen atom, an alkyl group, an alkoxy group, a nitro group, an alkenyl group, an aryl group, an aralkyl group, an alkoxycarbonyl group, an arylcarbonyl group, an acyloxy group, an acyl group, an aryloxy group or an aralkyloxy group, provided that six substituents represented by the same symbol may not be the same group; and at least two $R^6$ groups represent an —O—C($R_{O1}$)($R_{O2}$)—COO—C($R_{O3}$)($R_{O4}$)($R_{O5}$) group and the rest(s) is/are a hydrogen atom or a hydroxyl group.

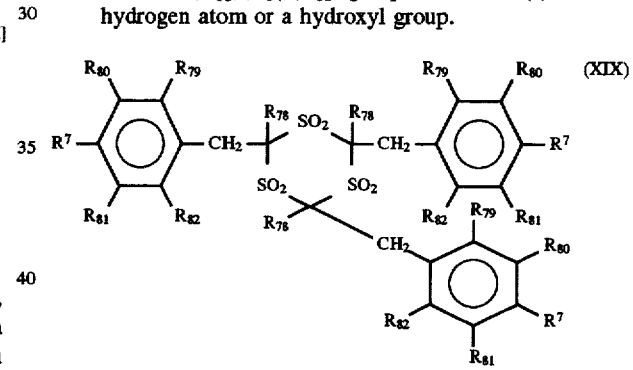

(XIX)

wherein $R_{78}$ represents a hydrogen atom or an alkyl group, provided that all $R_{78}$ groups may not be the same;

$R_{79}$ to $R_{82}$ each represents a hydrogen atom, a hydroxyl group, a halogen atom, an alkyl group or an alkoxy group, provided that three substituents represented by the same symbol may not be the same group; and at least two $R^7$ groups represents an —O—C($R_{O1}$)($R_{O2}$)—COO—C($R_{O3}$)($R_{O4}$)($R_{O5}$) group and the rest(s) is/are a hydrogen atom or a hydroxyl group.

Preferred and specific examples of the compounds are set forth below.

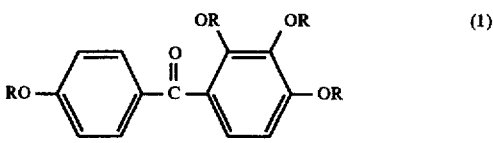

(1)

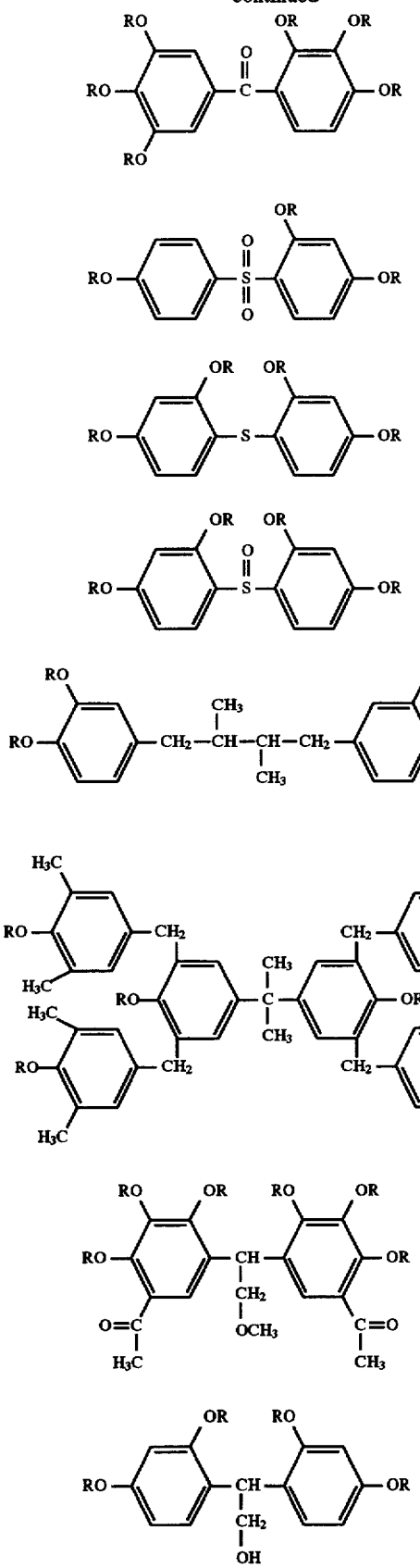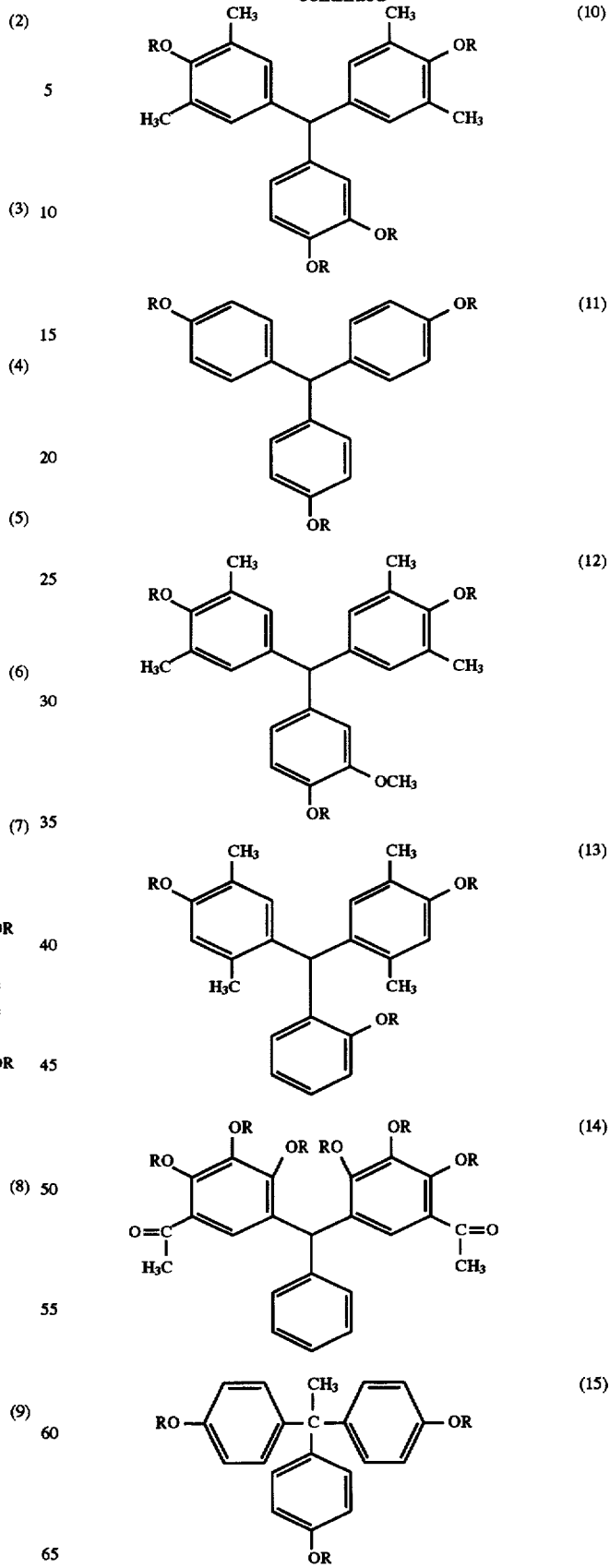

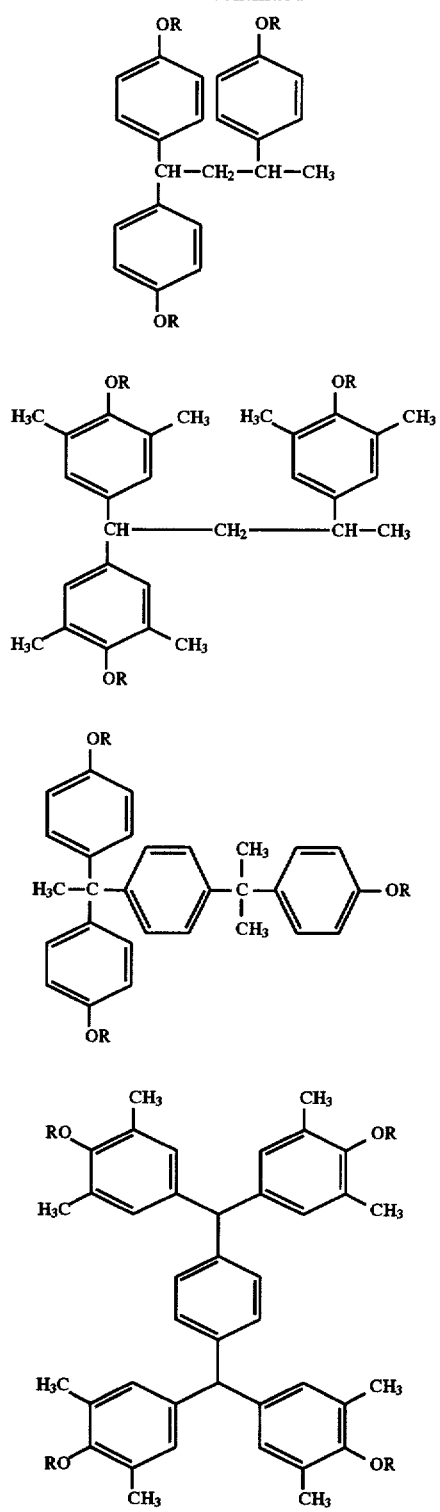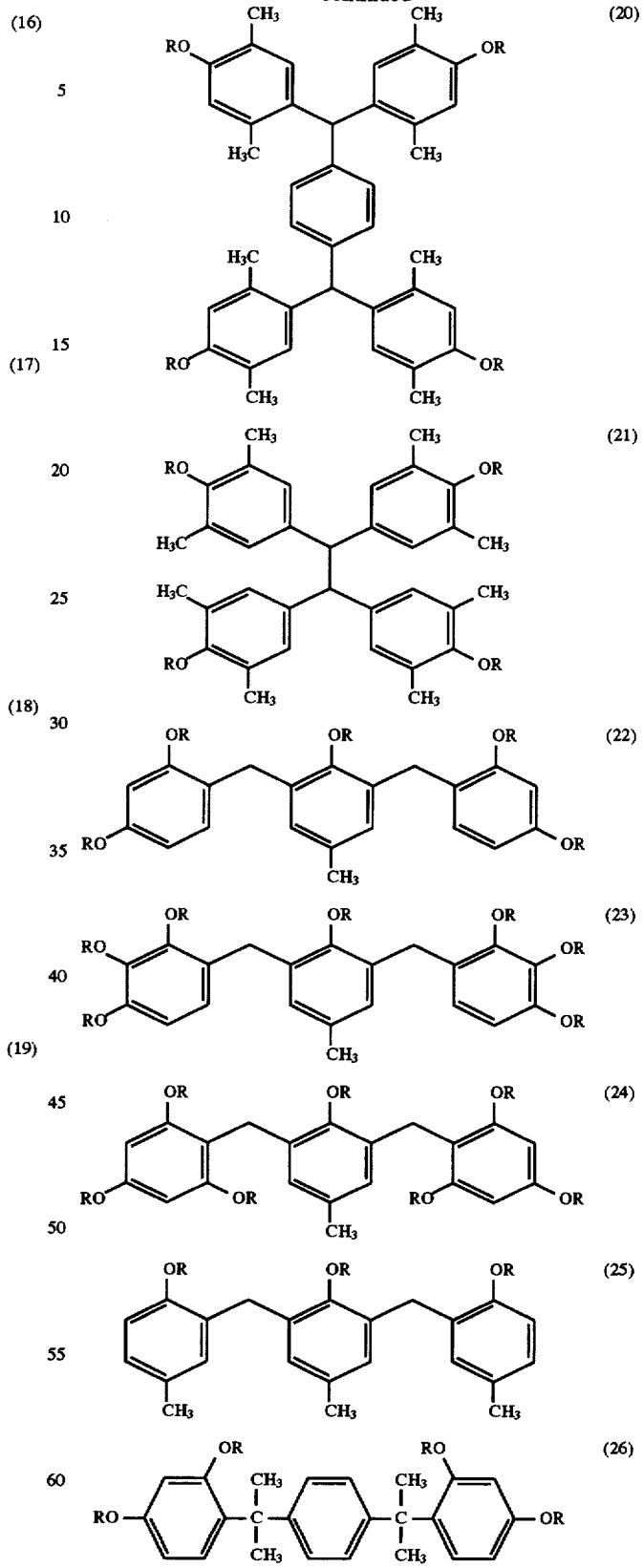

-continued
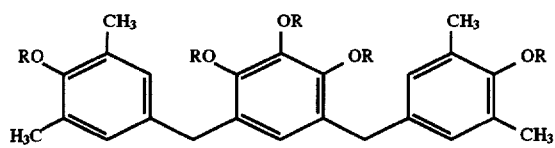(27)
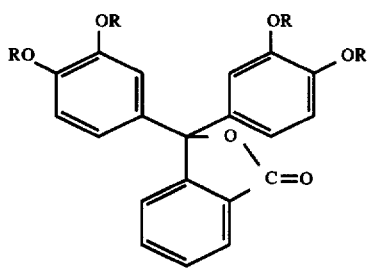(28)
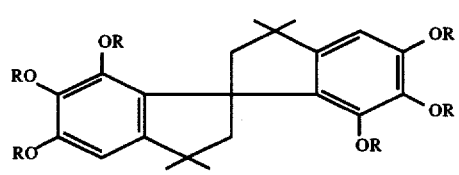(29)
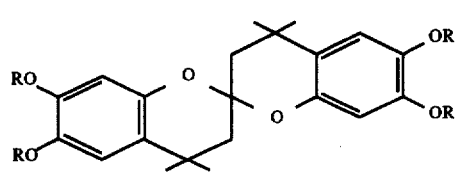(30)
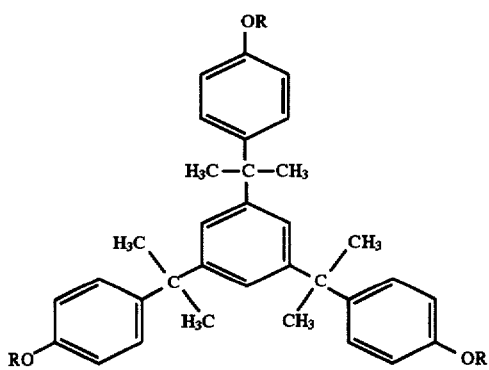(31)
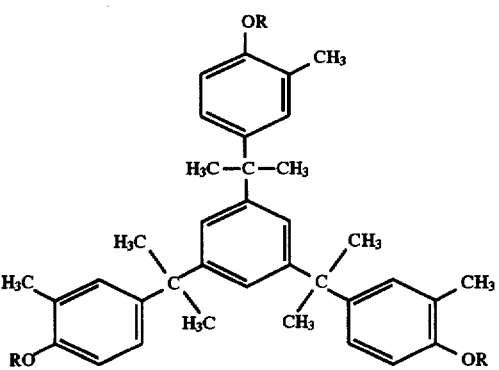(32)
-continued
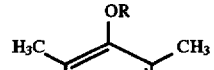(33)
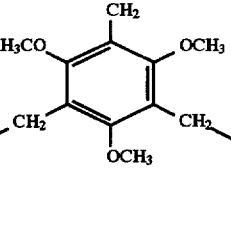
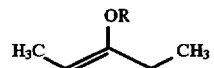(34)
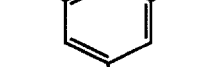
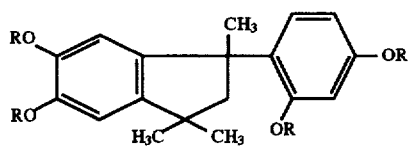(35)
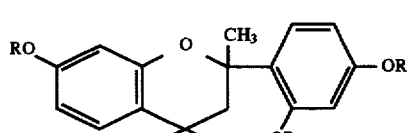(36)
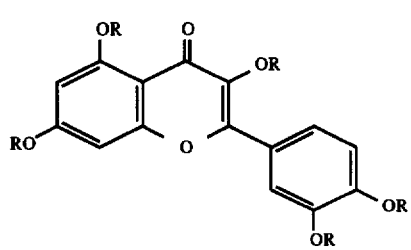(37)
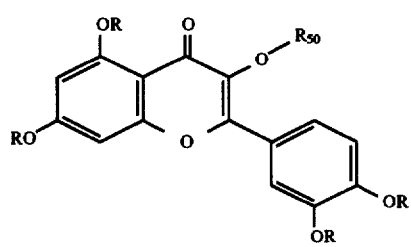(38)

provided that $R_{50}$ is:
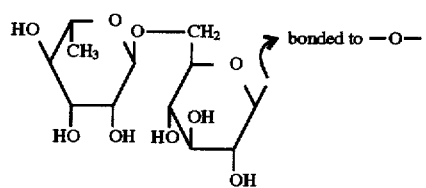
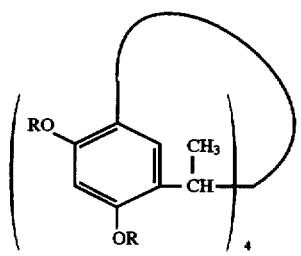
(39)
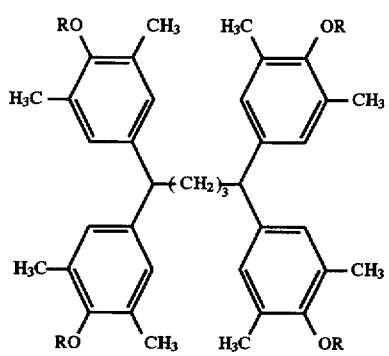
(40)
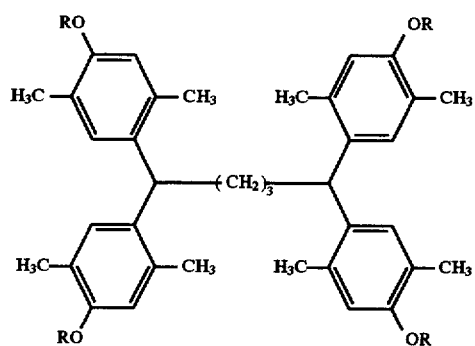
(41)
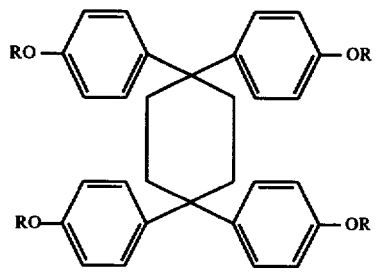
(42)
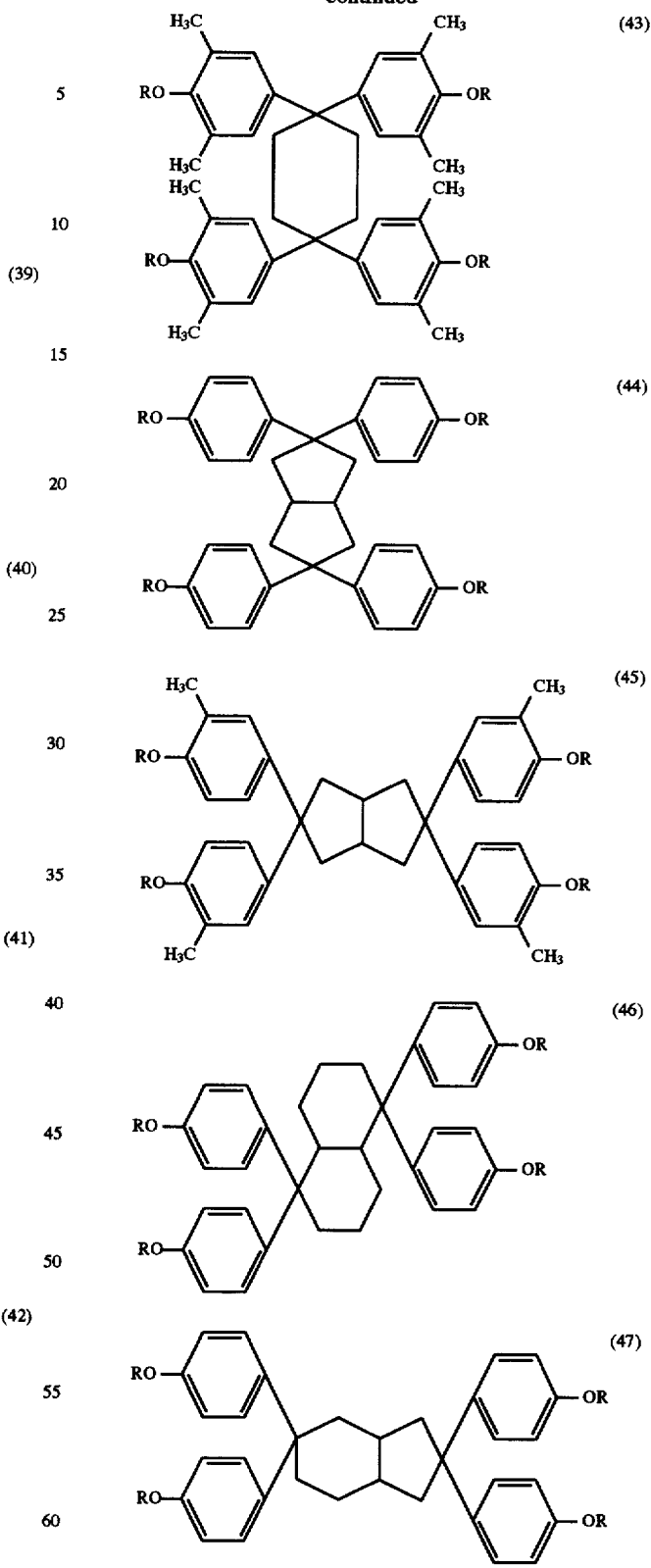
(43)
(44)
(45)
(46)
(47)

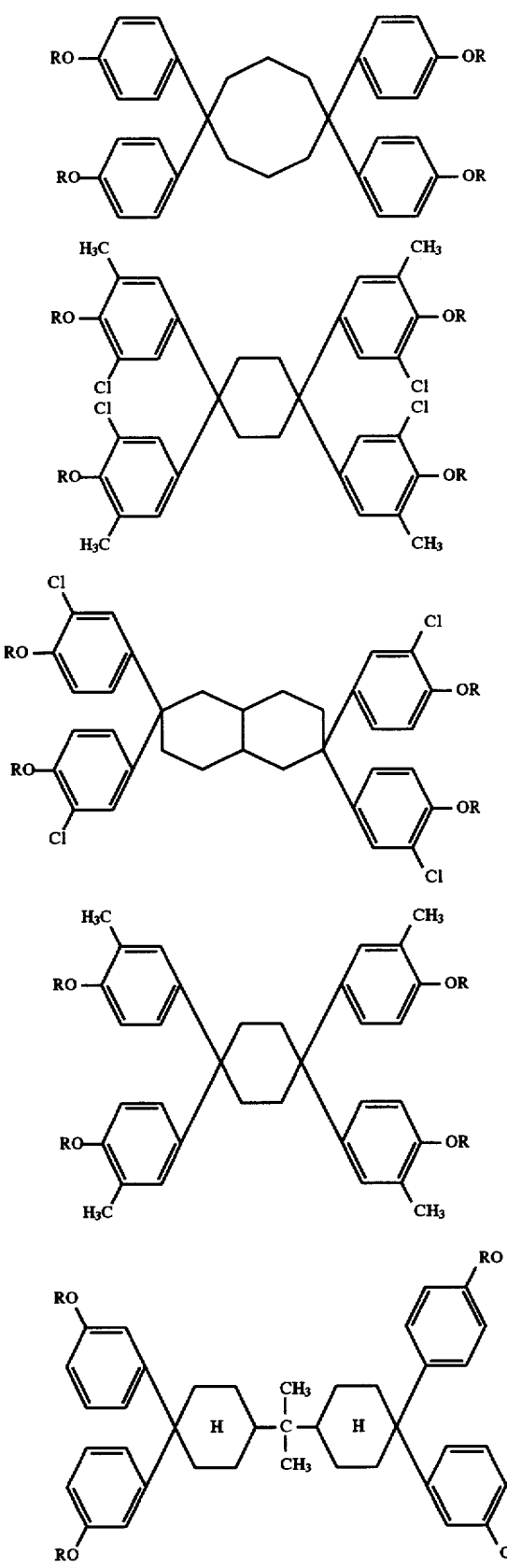
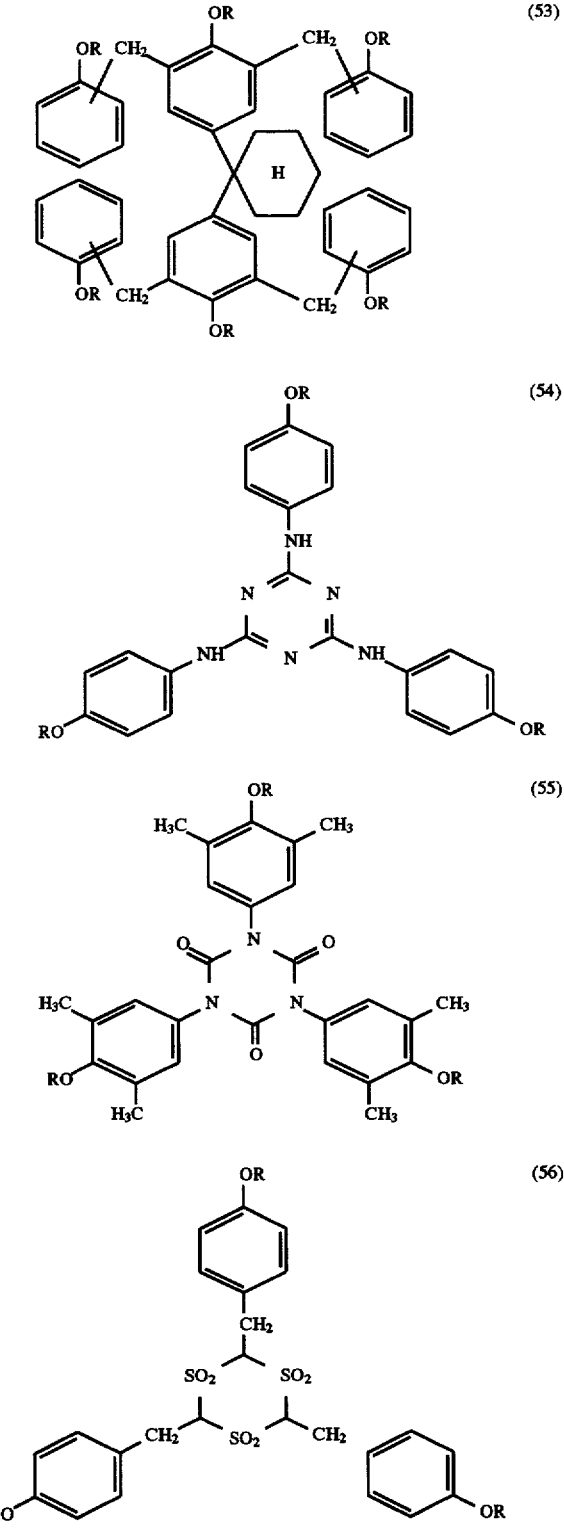

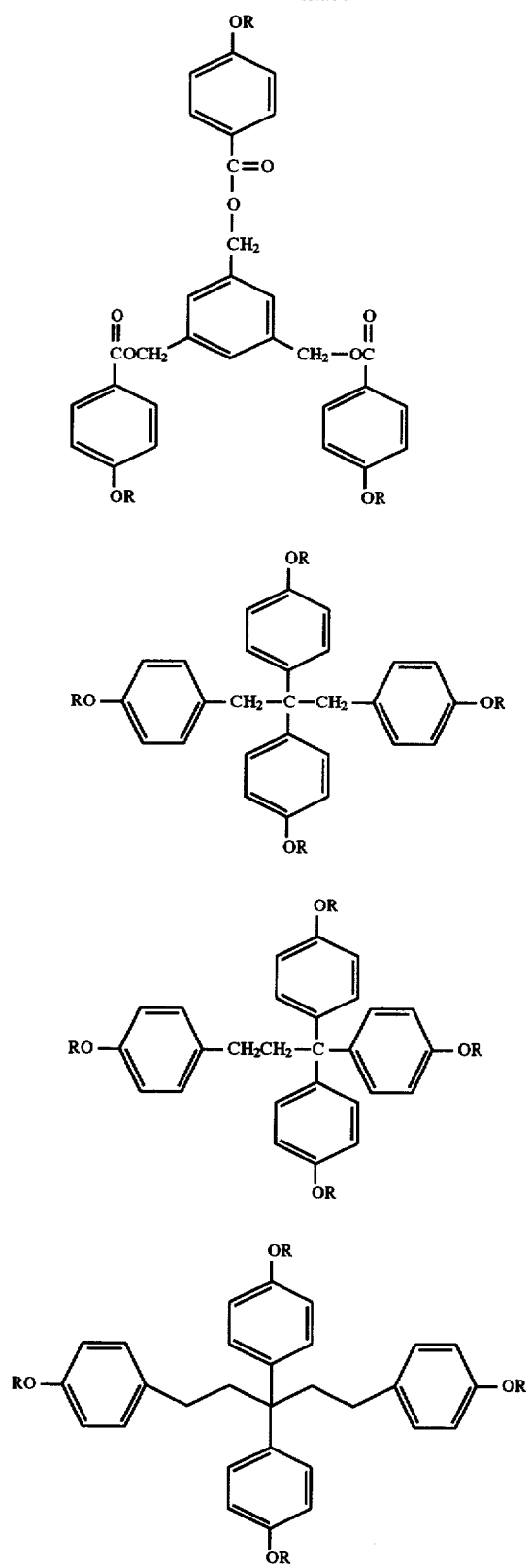

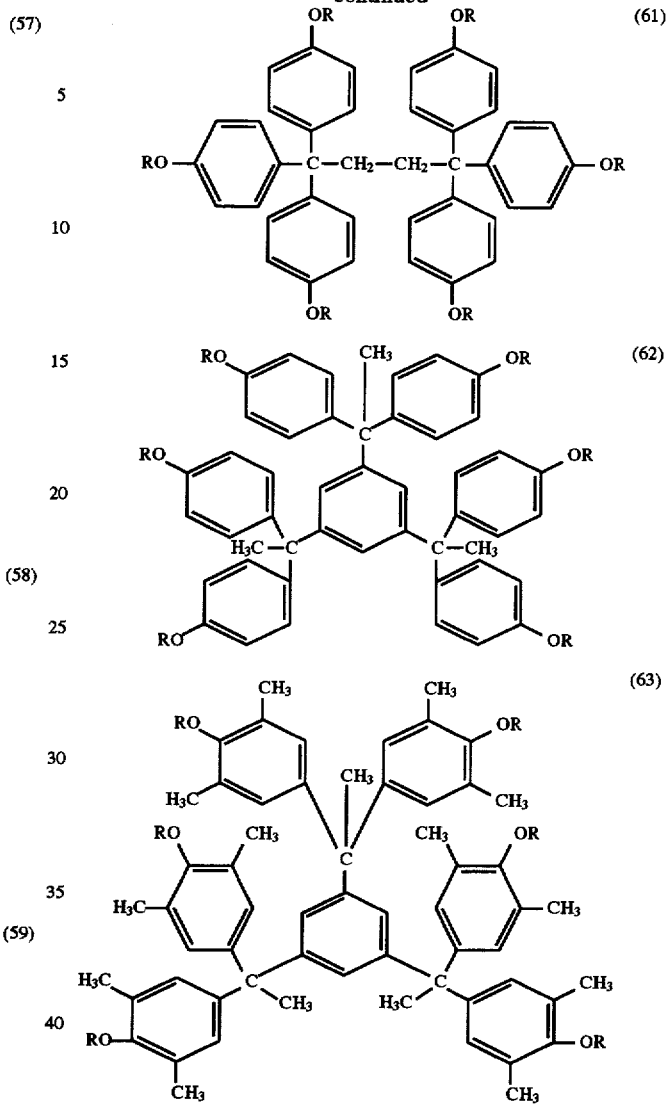

R in each of Compounds (1) to (63) represents —CH$_2$—COO—C$_4$H$_9^t$ or a hydrogen atom, provided that at least two R groups, or three R groups depending upon the structure, are a group other than a hydrogen atom and the ratio of the acid-decomposable group and the alkali-soluble group falls with in the range 0.01≦NS/(NB+NS)≦0.75, wherein NB is the average number of acid-decomposable groups in the dissolution inhibitor and NS is the average number of alkali-soluble groups.

The addition amount of the compound (c) of the present invention is usually from 3 to 50% by weight, preferably from 5 to 35% by weight, based on the total amount of the resist composition (excluding the solvent).

The compounds used as the compound (c) of the present invention may be used in combination of two or more thereof. Each of the sodium content and the potassium content in the resist composition of the present invention using the compound (c) of the present invention is usually 30 ppb or less, preferably 20 ppb or less, more preferably 15 ppb or less, still more preferably 10 ppb or less.

(B) Resin insoluble in water but soluble in aqueous alkali solution (hereinafter sometimes referred to as "alkali-soluble resin") (compound (b) of the present invention)

Examples of the alkali-soluble resin for use in the present invention includes novolak resin, hydrogenated novolak resin, acetone-pyrogallol resin, o-, m- or p-polyhydroxystyrene, hydrogenated polyhydroxystyrene, halogen-substituted polyhydroxystyrene, alkyl-substituted polyhydroxystyrene, hydroxystyrene-N-substituted maleimido copolymer, o/p- or m/p-hydroxystyrene copolymer, partially O-alkylation product to the hydroxyl group of polyhydroxystyrene (namely, an ether form, e.g., from 5 to 30 mol % O-methylation product, O-(1-methoxy)-1-ethylation product, O-(1-ethoxy)-1-ethylation product, O-(2-ethoxy)-2-propylation product, O-2-tetrahydropyranylation product, O-(t-butoxycarbonyl) methylation product), partially O-acylation product to the hydroxyl group of polyhydroxystyrene (namely, an ester form, e.g., from 5 to 30 mol % O-acetylation product, O-(t-butoxy)carbonylation product), styrene-maleic anhydride copolymer, styrene hydroxystyrene copolymer, α-methylstyrene-hydroxystyrene copolymer and carboxyl group-containing methacrylic resin or a derivative thereof, however, the present invention is by no means limited to these.

More preferred examples of the alkali-soluble resin include novolak resin, o-, m- or p-polyhydroxystyrene and copolymers thereof, alkyl-substituted polyhydroxystyrene, partially O-alkylation or O-acylation product of polyhydroxystyrene, styrene-hydroxystyrene copolymer and α-methylstyrene-hydroxystyrene copolymer. The novolak resin can be obtained by addition-condensing a prescribed monomer as a main component with an aldehyde in the presence of an acid catalyst.

Examples of the prescribed monomer include phenol, cresols such as m-cresol, p-cresol and o-cresol, xylenols such as 2,5-xylenol, 3,5-xylenol, 3,4-xylenol and 2,3-xylenol, alkylphenols such as m-ethylphenol, p-ethylphenol, o-ethylphenol, p-t-butylphenol, p-octylphenol and 2,3,5-trimethylphenol, alkoxyphenols such as p-methoxyphenol, m-methoxyphenol, 3,5-dimethoxyphenol, 2-methoxy-4-methylphenol, m-ethoxyphenol, p-ethoxyphenol, m-propoxyphenol, p-propoxyphenol, m-butoxyphenol and p-butoxyphenol, bisalkylphenols such as 2-methyl-4-isopropylphenol, and hydroxy aromatic compounds such as m-chlorophenol, p-chlorophenol, o-chlorophenol, dihydroxybiphenyl, bisphenol A, phenylphenol, resorcinol and naphthol, which may be used individually or in combination of two or more thereof. However, the present invention is by no means limited to these.

Example of the aldehyde include formaldehyde, paraformaldehyde, acetaldehyde, propionaldehyde, benzaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-n-butylbenzaldehyde, furfural, chloroaldehyde and an acetal form of these such as chloroacetaldehydediethylacetal, and among them, formaldehyde is preferred.

These aldehydes may be used individually or in combination of two or more thereof.

Examples of the acid catalyst include hydrochloric acid, sulfuric acid, formic acid, acetic acid and oxalic acid.

The thus-obtained novolak resin has a weight average molecular weight of preferably from 1,000 to 30,000. If the weight average molecular weight is less than 1,000, decrease in the film thickness in the unexposed area after development becomes large, whereas if it exceeds 30,000, the development rate is reduced. The weight average molecular weight of the novolak resin is more preferably from 2,000 to 20,000.

The polyhydroxystyrene, the derivative thereof or the copolymer thereof other than the novolak resin has a weight average molecular weight of 2,000 or more, preferably from 5,000 to 200,000, more preferably from 10,000 to 100,000, and in view of improvement in heat durability of the resist film, preferably 25,000 or more.

The weight average molecular weight as used herein is defined as a value calculated in terms of polystyrene in the gel permeation chromatography.

These alkali-soluble resins for use in the present invention may be used in combination of two or more thereof. The amount of the alkali-soluble resin is from 50 to 97% by weight, preferably from 60 to 90% by weight, based on the total weight of the photosensitive composition excluding the solvent.

(C) Compound which generates an acid upon irradiation with active light or radiant ray (compound (a) of the present invention)

The compound which generates an acid by decomposition upon irradiation with active light or radiant ray for use in the present invention may be selected from a photocationic polymerization photoinitiator, a photoradical polymerization photoinitiator, a dye photodecolorizer or photodiscolorizer, a known compound for microresist which generates an acid by light and the like, or a mixture of them.

Examples of these compounds include diazonium salts described in S. I. Schlesinger, Photogr. Sci. Eng., 18, 387 (1974) and T. S. Bal et al., Polymer, 21, 423 (1980); ammonium salts described in U.S. Pat. Nos. 4,069,055, 4,069,056 and Re 27,992 and JP-A-4-365049; phosphonium salts described in D. C. Necker et al., Macromolecules, 17, 2468 (1984), C. S. Wen et al., Teh, Proc. Conf. Rad. Curing ASIA, p. 478, Tokyo (October, 1988) and U.S. Pat. Nos. 4,069,055 and 4,069,056; iodonium salts described in J. V. Crivello et al, Macromolecules, 10 (6), 1307 (1977), Chem. & Eng. News, Nov. 28, p. 31 (1988), European Patent 104,143, U.S. Pat. Nos. 339,049 and 410,201, JP-A-2-150848 and JP-A-2-296514; sulfonium salts described in J. V. Crivello et al., Polymer J. 17, 73 (1985), J. V. Crivello et al., J. Org. Chem., 43, 3055 (1978), W. R. Watt et al., J. Polymer Sci., Polymer Chem. Ed., 22, 1789 (1984), J. V. Crivello et al., Polymer Bull., 14, 279 (1985), J. V. Crivello et al., Macromolecules, 14 (5), 1141 (1981), J. V. Crivello et al., J. Polymer Sci., Polymer Chem. Ed., 17, 2877 (1979), European Patents 370,693, 3,902,114, 233,567, 297,443 and 297,442, U.S. Pat. Nos. 4,933,377, 161,811, 410,201, 339, 049, 4,760,013, 4,734,444 and 2,833,827, and German Patent 2,904,626, 3,604,580 and 3,604,581; selenonium salts described in J. V. Crivello et al., Macromolecules, 10(6), 1307 (1977), and J. V. Crivello et al., J. Polymer Sci., Polymer Chem. Ed., 17, 1047 (1979); onium salts such as arsonium salt described in C. S. Wen et al., Teh, Proc. Conf. Rad. Curing ASIA, p. 478, Tokyo (October, 1988); organic halogen compounds described in U.S. Pat. No. 3,905,815, JP-B-46-4605 (the term "JP-B" as used herein means an "examined Japanese patent publication"), JP-A-48-36281, JP-A-55-32070, JP-A-60-239736, JP-A-61-169835, JP-A-61-169837, JP-A-62-58241, JP-A-62-212401, JP-A-63-70243 and JP-A-63-298339; organic metal/organic halides described in K. Meier et al., J. Rad. Curing, 13 (4), 26 (1986), T. P. Gill et al., Inorg. Chem., 19, 3007 (1980), D.

Astruc, Acc. Chem. Res., 19 (12), 377 (1896) and JP-A-2-161445; photo acid generators having an o-nitrobenzyl-type protective group described in S. Hayase et al., J. Polymer Sci., 25, 753 (1987), E. Reichmanis et al., J. Polymer Sci., Polymer Chem. Ed., 23, 1 (1985), Q. Q. Zhu et al., J. Photochem., 36, 85, 39, 317 (1987), B. Amit et al., Tetrahedron Lett., (24) 2205 (1973), D. H. R. Barton et al., J. Chem. Soc., 3571 (1965), P. M. Collins et al., J. Chem. Soc., Perkin I, 1695 (1975), M. Rudinstein et al., Tetrahedron Lett., (17), 1445 (1975), J. W. Walker et al., J. Am. Chem. Soc., 110, 7170 (1988), S. C. Busman et al., J. Imaging Technol., 11 (4), 191 (1985), H. M. Houlihan et al., Macromolecules, 21, 2001 (1988), P. M. Collins et al., J. Chem. Soc., Chem. Commun., 532 (1972), S. Hayase et al., Macromolecules, 18, 1799 (1985), E. Reichmanis et al., J. Electrochem. Soc., Solid State Sci. Technol., 130 (6), F. M. Houlihan et al., Macromolecules, 21, 2001 (1988), European Patents 0,290,750, 046,083, 156,535, 271,851 and 0,388,343, U.S. Pat. Nos. 3,901,710 and 4,181,531, JP-A-60-198538, and JP-A-53-133022; compounds which generate a sulfonic acid by photolysis as represented by iminosulfonate described in M. Tunooka et al., Polymer Preprints Japan, 35 (8), G. Berner et al., J. Rad. Curing, 13 (4), W. J. Mijs et al., Coating Technol., 55 (697), 45 (1983), Akzo, H. Adachi et al., Polymer Preprints, Japan, 37 (3), European Patents 0,199,672, 84,515,199,672,044,115 and 0,101,122, U.S. Pat. Nos. 4,618,564, 4,371,605, 4,431,774, JP-A-64-18143, JP-A-2-245756 and JP-A-4-365048; and disulfone compounds described in JP-A-61-166544.

Also, compounds resulting from introduction of the above-described group or compound which generates an acid by light into their main or side chain may be used and examples thereof include compounds described in M. E. Woodhouse et al., J. Am. Chem. Soc., 104, 5586 (1982), S. P. Pappas et al., J. Imaging Sci., 30 (5), 218 (1986), S. Kondo et al., Makromol Chem., Rapid Commun., 9, 625 (1988), Y. Yamada et al., Makromol. Chem., 152, 153, 163 (1972), J. V. Crivello et al., J. Polymer Sci., Polymer Chem. Ed., 17, 3845 (1979), U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029.

Further, compounds which generates an acid by light described in V. N. R. Pillai, Synthesis, (1), 1 (1980), A. Abad et al., Tetrahedron Lett., (47) 4555 (1971), D. H. R. Barton et al., J. Chem. Soc., (C), 329 (1970), U.S. Pat. No. 779,778 and European Patent 126,712 can also be used.

Among the above-described compounds which decompose upon irradiation with active light or radiant ray to generate an acid, particularly effective compounds are described below.

(1) Trihalomethyl group-substituted oxazole derivative represented by formula (PAG1) or trihalomethyl group-substituted s-triazine derivative represented by formula (PAG2)

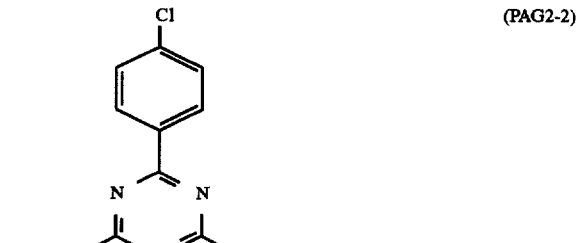

wherein $R^1$ represents a substituted or unsubstituted aryl or alkenyl group, $R^2$ represents a substituted or unsubstituted aryl, alkenyl or alkyl group or $-CY_3$ (wherein $Y_3$ represents a chlorine atom or a bromine atom).

Specific examples thereof include the following compounds but the present invention is by no means limited to these.

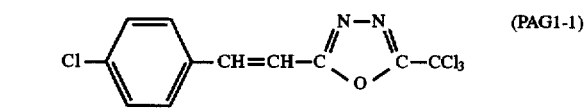
(PAG1-1)

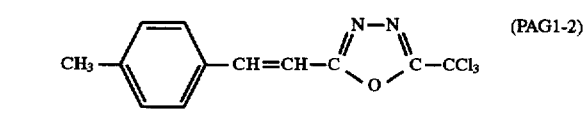
(PAG1-2)

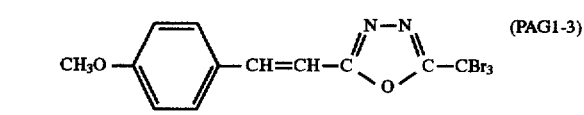
(PAG1-3)

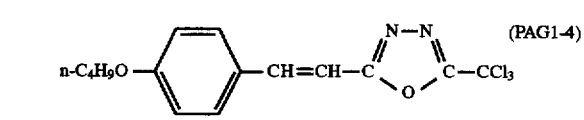
(PAG1-4)

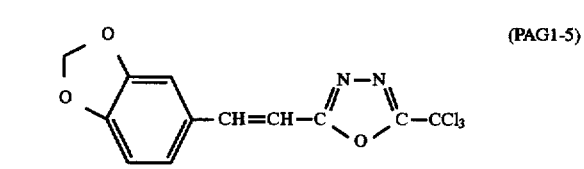
(PAG1-5)

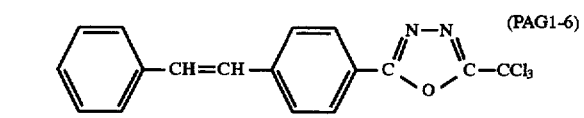
(PAG1-6)

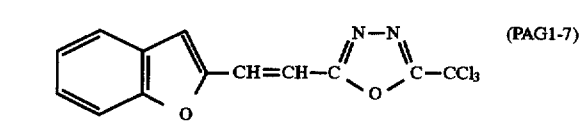
(PAG1-7)

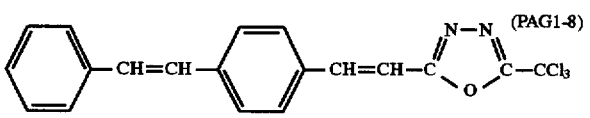
(PAG1-8)

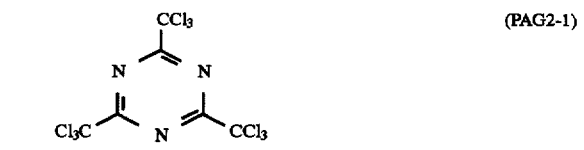
(PAG2-1)

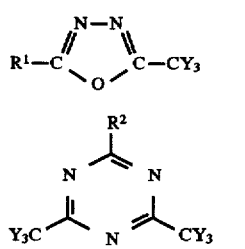
(PAG2-2)

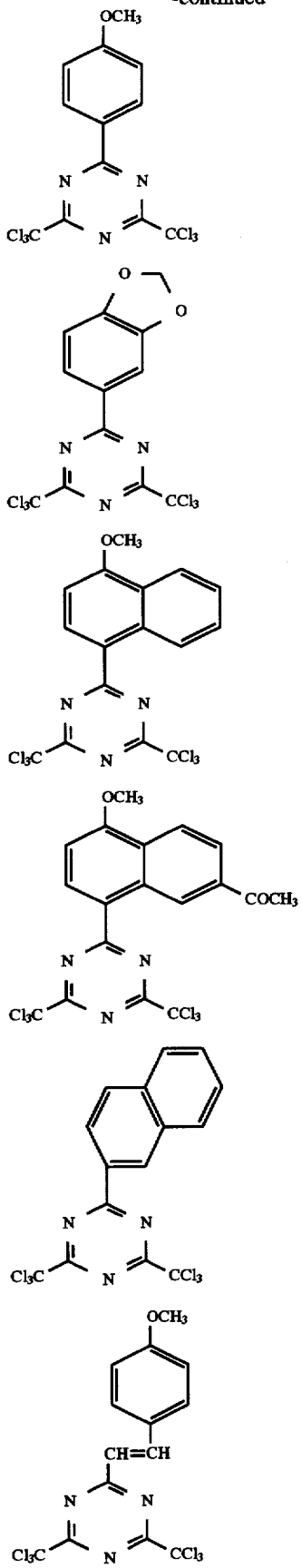

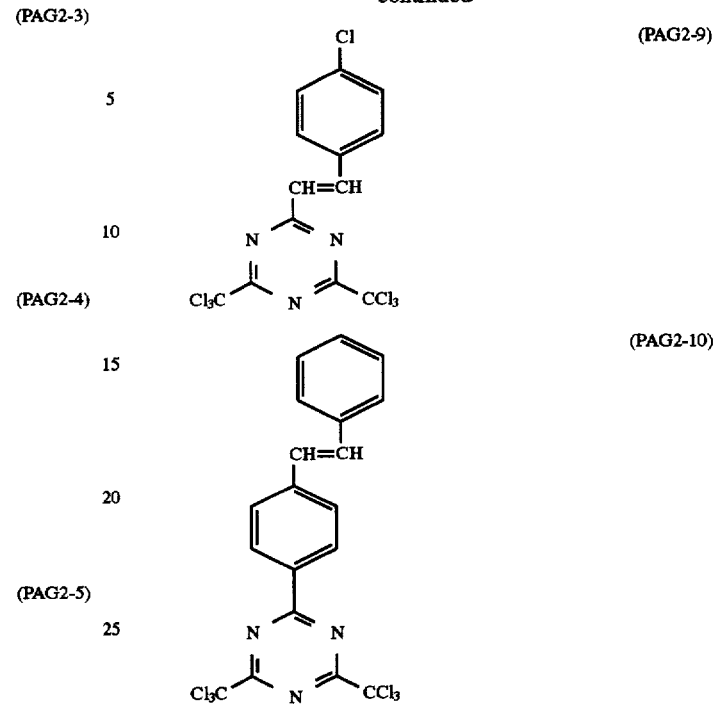

(2) Iodonium salt represented by formula (PAG3) or sulfonium salt represented by formula (PAG4)

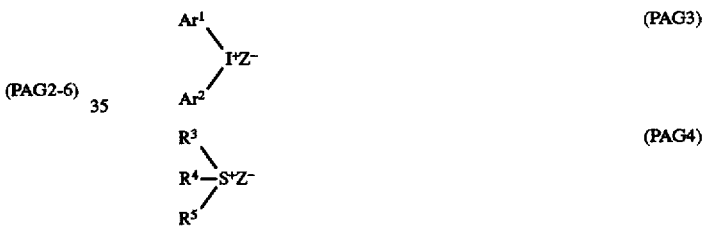

wherein $Ar^1$ and $Ar^2$ each independently represents a substituted or unsubstituted aryl group. Preferred examples of the substituent include an alkyl group, a haloalkyl group, a cycloalkyl group, an aryl group, an alkoxy group, a nitro group, a carboxyl group, an alkoxycarbonyl group, a hydroxy group, a mercapto group and a halogen atom.

$R^3$, $R^4$ and $R^5$ each independently represents a substituted or unsubstituted alkyl or aryl group, preferably an aryl group having from 6 to 14 carbon atoms, an alkyl group having from 1 to 8 carbon atoms or a substitution derivative thereof. The substituent of the aryl group is preferably an alkoxy group having from 1 to 8 carbon atoms, an alkyl group having from 1 to 8 carbon atoms, a nitro group, a carboxyl group, a hydroxy group or a halogen atom and the substituent of the alkyl group is preferably an alkoxy group having from 1 to 8 carbon atoms, a carboxyl group or an alkoxycarbonyl group.

$Z^-$ represents a counter anion and examples thereof include a perfluoroalkanesulfonic acid anion such as $BF_4^-$, $AsF_6^-$, $PF_6^-$, $SbF_6^-$, $SiF_6^{2-}$, $ClO_4^-$ or $CF_3SO_3^-$, a pentafluorobenzenesulfonic acid anion, a condensed polynuclear aromatic sulfonic acid anion such as naphthalene-1-sulfonic acid anion, an anthraquinonesulfonic acid anion and a sulfonic acid group-containing dye, but the present invention is by no means limited thereto.

Two of $R^3$, $R^4$ and $R^5$ or $Ar^1$ and $Ar^2$ may be bonded through a single bond or a substituent.

Specific examples of the foregoing compounds include the following compounds, however, the present invention is by no means limited to these.
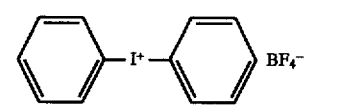 (PAG3-1)
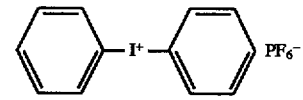 (PAG3-2)
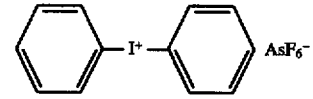 (PAG3-3)
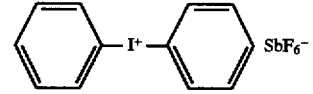 (PAG3-4)
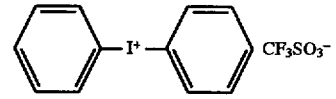 (PAG3-5)
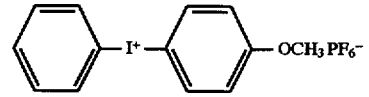 (PAG3-6)
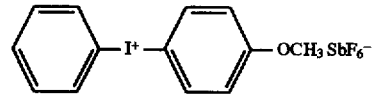 (PAG3-7)
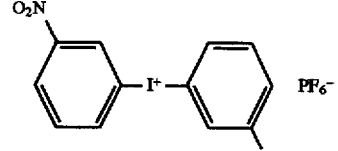 (PAG3-8)
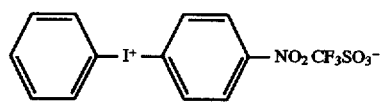 (PAG3-9)
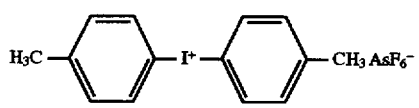 (PAG3-10)
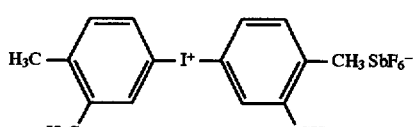 (PAG3-11)
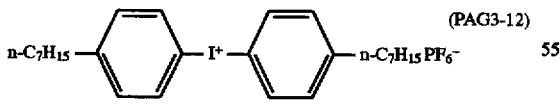 (PAG3-12)
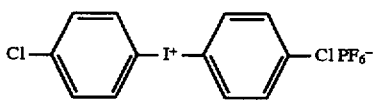 (PAG3-13)
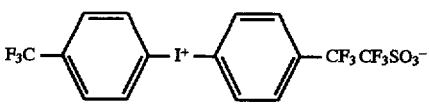 (PAG3-14)
-continued
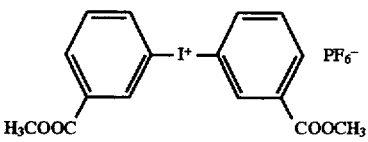 (PAG3-15)
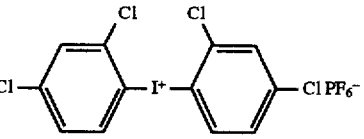 (PAG3-16)
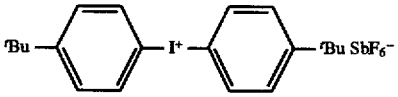 (PAG3-17)
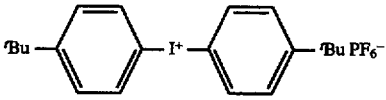 (PAG3-18)
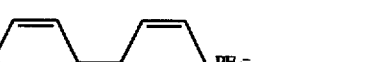 (PAG3-19)
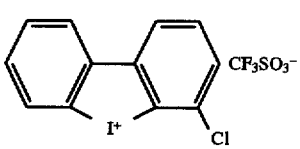 (PAG3-20)
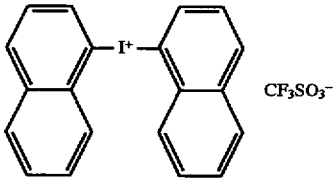 (PAG3-21)
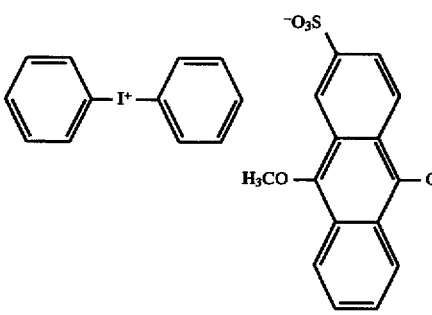 (PAG3-22)
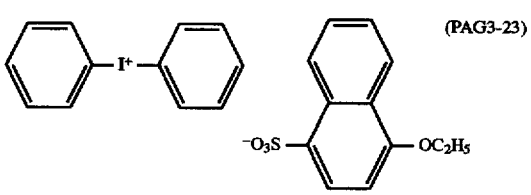 (PAG3-23)

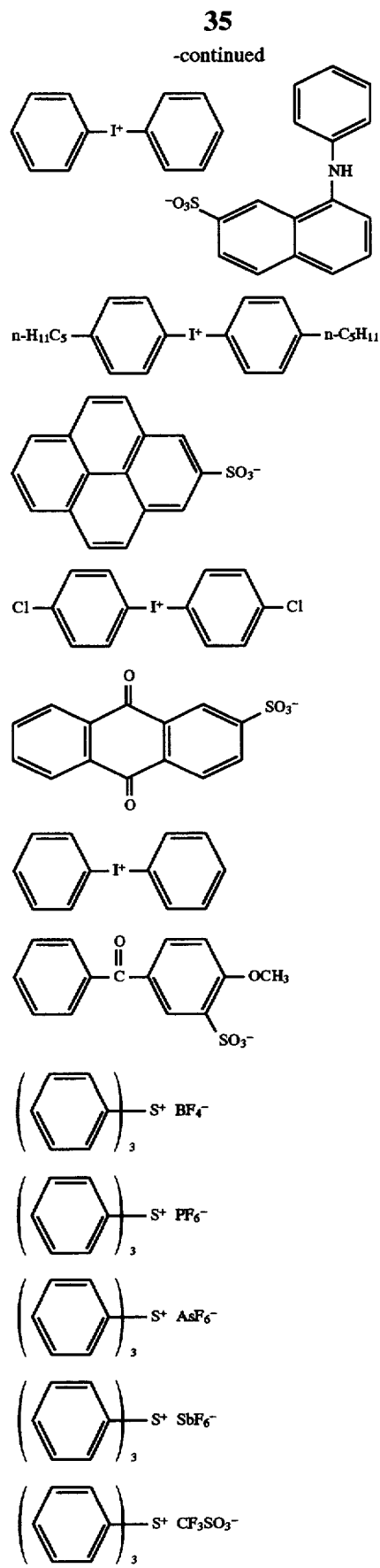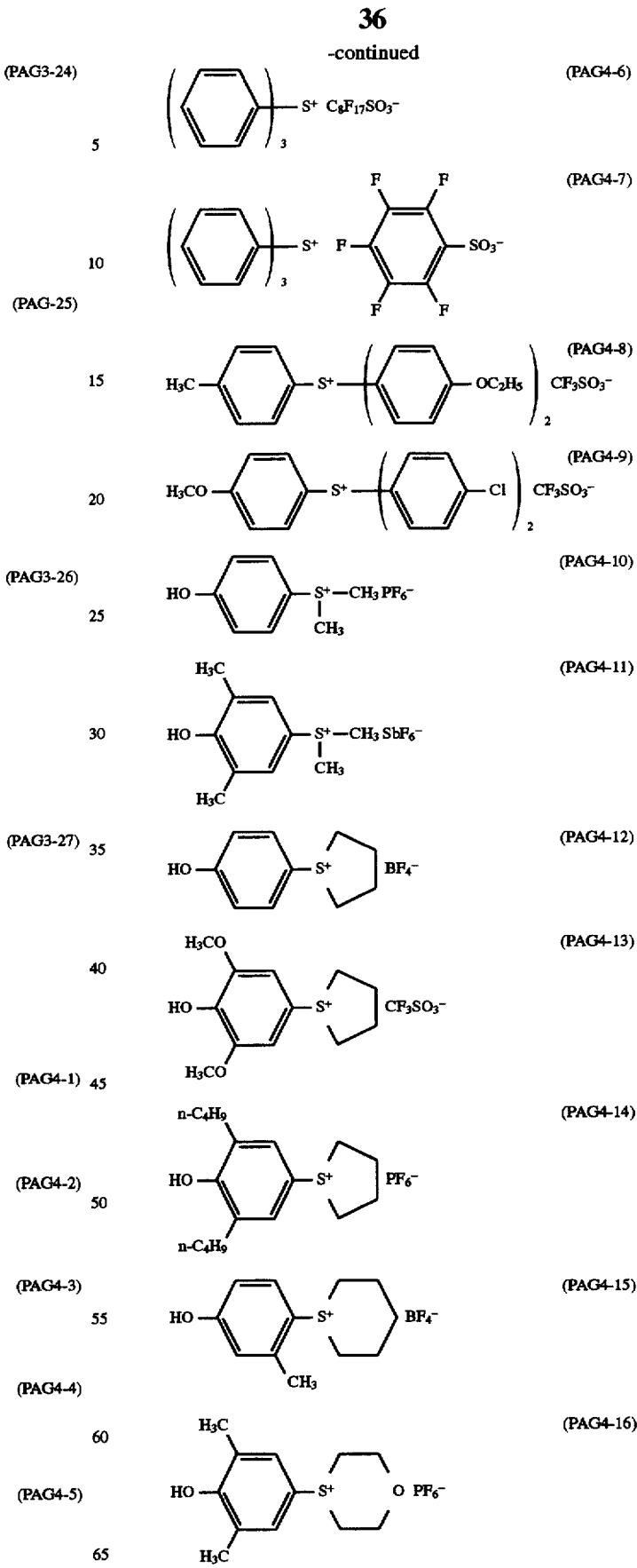

-continued

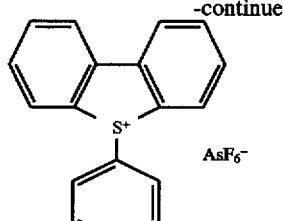 (PAG4-17)

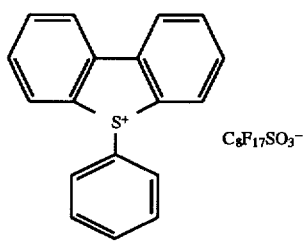 (PAG4-18)

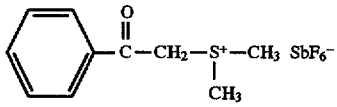 (PAG4-19)

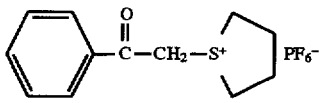 (PAG4-20)

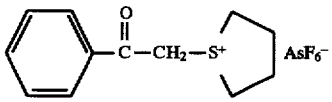 (PAG4-21)

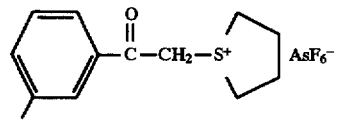 (PAG4-22)

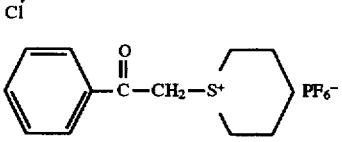 (PAG4-23)

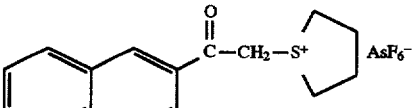 (PAG4-24)

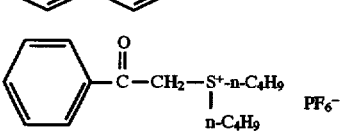 (PAG4-25)

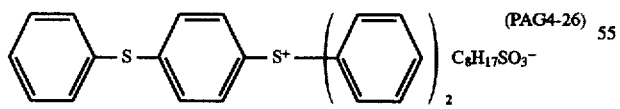 (PAG4-26)

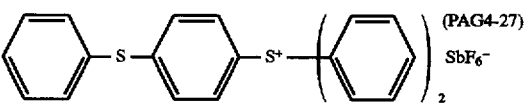 (PAG4-27)

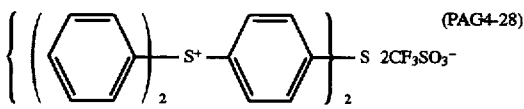 (PAG4-28)

-continued

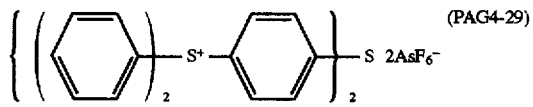 (PAG4-29)

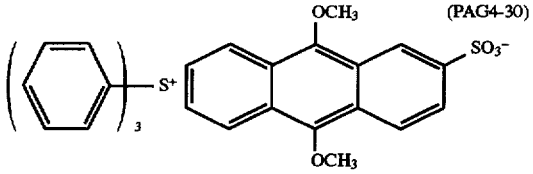 (PAG4-30)

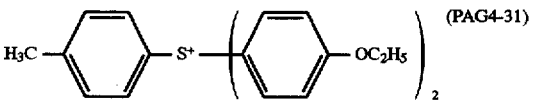 (PAG4-31)

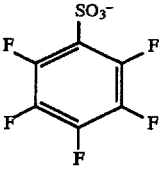 (PAG4-32)

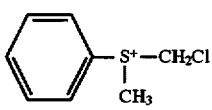

 (PAG4-32)

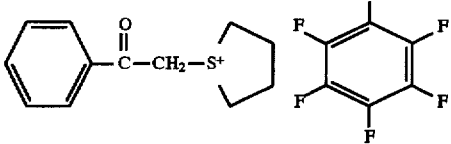 (PAG4-33)

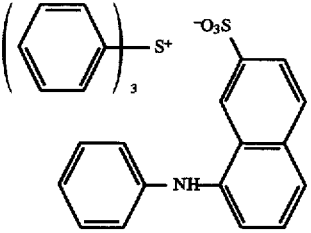 (PAG4-34)

The above-described onium salts represented by formulae (PAG3) and (PAG4) are known and can be synthesized by the method described, for example, in J. W. Knapczyk et al., *J. Am. Chem. Soc.*, 91, 145 (1969), A. L. Maycok et al., *J. Org. Chem.*, 35, 2532 (1970), E. Goethas et al., *Bull. Soc. Chem. Belg.*, 73, 546 (1964), H. M. Leicester, *J. Ame. Chem. Soc.*, 51, 3587 (1929), J. V. Crivello et al., *J. Polym. Chem. Ed.*, 18, 2677 (1980), U.S. Pat. Nos. 2,807,648 and 4,247,473 and JP-A-53-101331.

(3) Disulfone derivative represented by formula (PAG5) or iminosulfonate derivative represented by formula (PAG6)

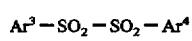 (PAG5)

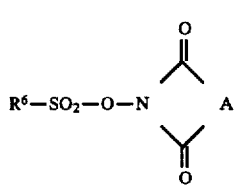 (PAG6)

wherein Ar³ and Ar⁴ each independently represents a substituted or unsubstituted aryl group, $R^6$ represents a substituted or unsubstituted alkyl or aryl group and A represents a substituted or unsubstituted alkylene, alkenylene or arylene group.

Specific examples of the derivatives include the following compounds, but the present invention is by no means limited thereto.

 (PAG5-1)

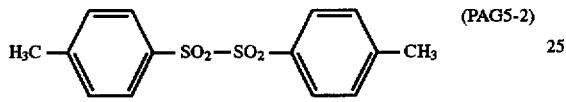 (PAG5-2)

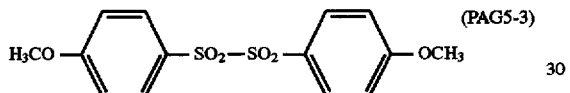 (PAG5-3)

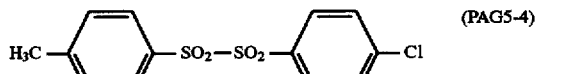 (PAG5-4)

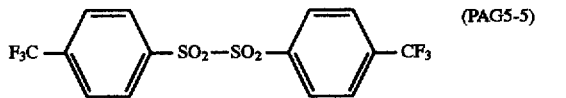 (PAG5-5)

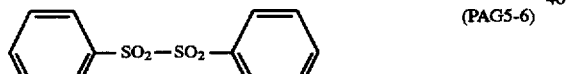 (PAG5-6)

 (PAG5-7)

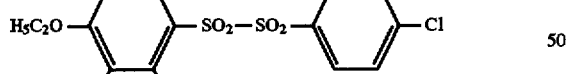 (PAG5-8)

 (PAG5-9)

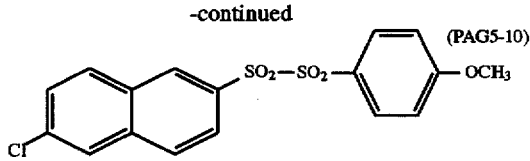 (PAG5-10)

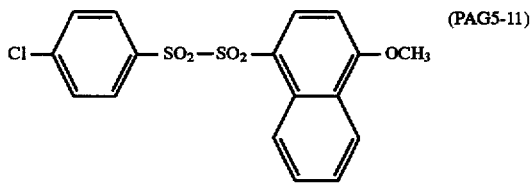 (PAG5-11)

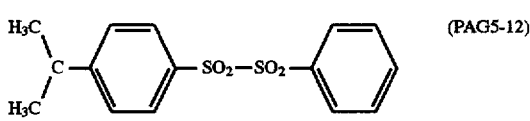 (PAG5-12)

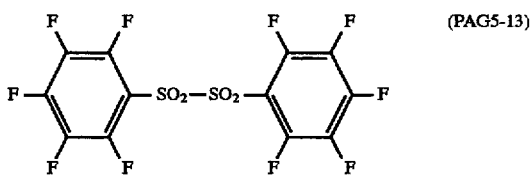 (PAG5-13)

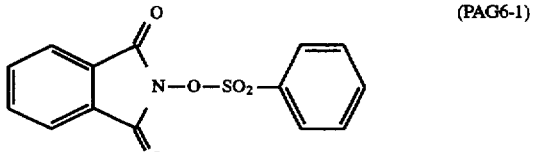 (PAG6-1)

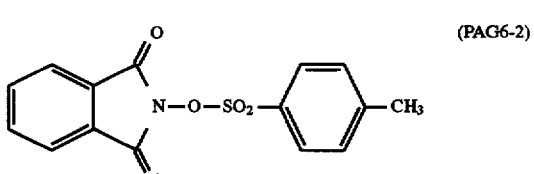 (PAG6-2)

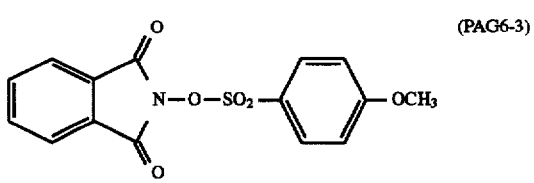 (PAG6-3)

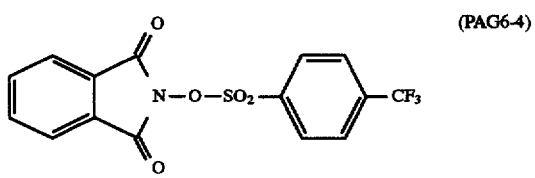 (PAG6-4)

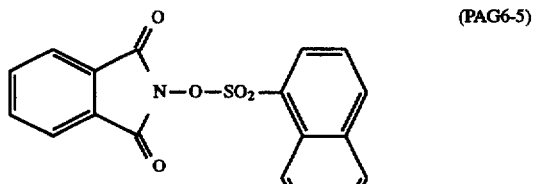 (PAG6-5)

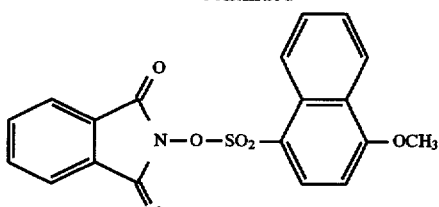
(PAG6-6)

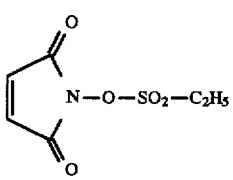
(PAG6-7)

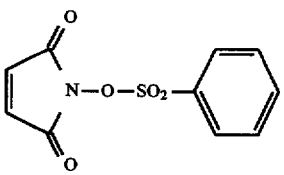
(PAG6-8)

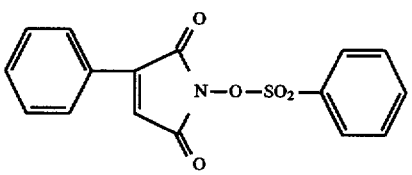
(PAG6-9)

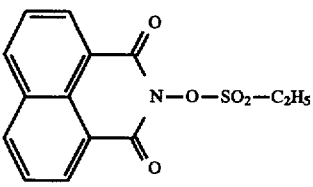
(PAG6-10)

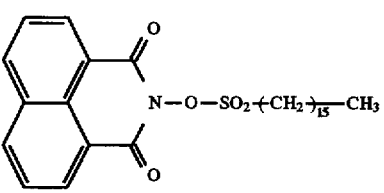
(PAG6-11)

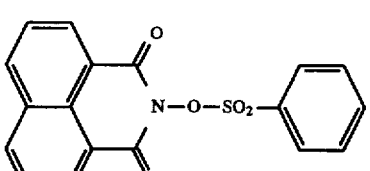
(PAG6-12)

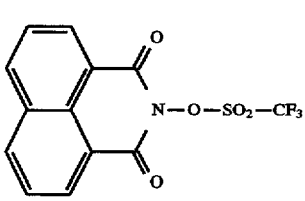
(PAG6-13)

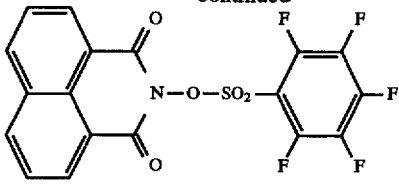
(PAG6-14)

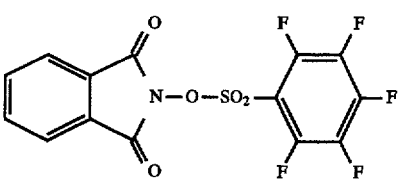
(PAG6-15)

The compound which decomposes upon irradiation with active light or radiant ray to generate an acid is used in an amount of usually from 0.001 to 40% by weight, preferably from 0.01 to 20% by weight, more preferably from 0.1 to 5% by weight, based on the total amount of the photosensitive composition excluding the coating solvent.

(D) Resin having an acid-decomposable alkyl ester group (the compound (d) of the present invention)

The resin having an acid-decomposable alkyl ester group as used in the present invention means a resin having an acid-decomposable alkyl ester group on the side chain of the resin.

The acid-decomposable group is the group represented by formula (I) described above.

Preferred examples of the ester moiety of the acid-decomposable alkyl ester group include a t-butyl ester group, t-pentyl ester group, a t-hexyl ester group, a cyclohexenyl ester group, a 2-cyclopropyl-2-propyl ester group, a cumyl ester group, a 1-methoxy-1-ethyl ester group, a 1-ethoxy-1-ethyl ester group and a tetrahydropyranyl ester group.

The base resin to which the above-described acid-decomposable group is bonded as a side chain is an alkali-soluble resin having —OH or —COOH, preferably —R°—COOH (wherein R° represents a divalent aliphatic or aromatic hydrocarbon group) or —Ar—OH group, on the side chain. An example of the base resin is the alkali-soluble resin as compound (b) of the present invention.

The alkali-soluble resin has an alkali dissolution rate, as determined (23° C.) with 0.261N tetramethyl ammonium hydroxide (TMAH), of 170 Å/sec or more, more preferably 330 Å/sec or more.

In order to achieve a rectangular profile, an alkali-soluble resin having a high transmittance to far ultraviolet ray or excimer laser beam is preferred. The transmittance at 248 nm is preferably from 20 to 80% when the film thickness is 1 μm.

From this point of view, the alkali-soluble resin is more preferably o-, m- or p-polyhydroxystyrene or copolymers thereof, hydrogenated polyhydroxystyrene, halogen- or alkyl-substituted polyhydroxystyrene, partially O-alkylation or O-acylation product of polyhydroxystyrene, styrene-hydroxystyrene copolymer, α-methylstyrene-hydroxystyrene copolymer or hydrogenated novolak resin.

The acid-decomposable group-containing resin of the present invention can be obtained by deoxidation-condensing a part or the whole of the —OH groups or the —COOH groups of the above-described alkali-soluble resin as a base polymer with a compound represented by formula (II) in the presence of a compound represented by formula (III), or by copolymerizing an alkali-soluble resin monomer to which an acid-decomposable group is bonded with a monomer of various kinds.

Specific examples of the acid-decomposable group-containing resin for use in the present invention are described below, but the present invention is by no means limited to these.
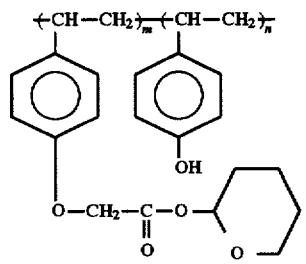 (i)
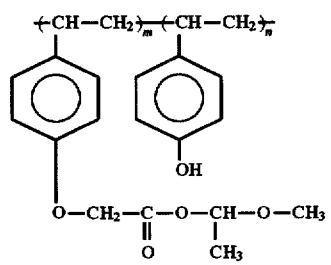 (ii)
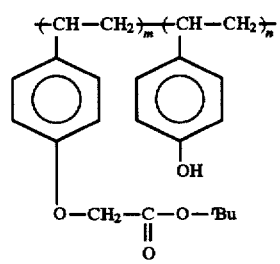 (iii)
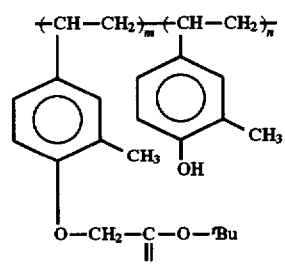 (iv)
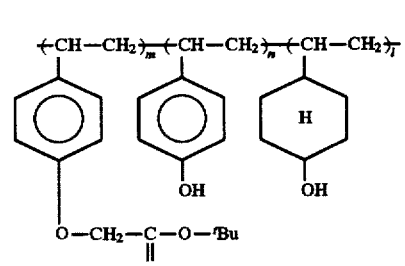 (v)
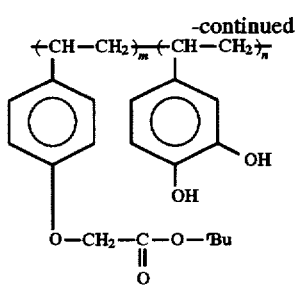 (vi)
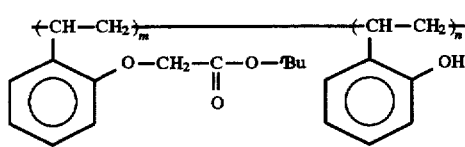 (vii)
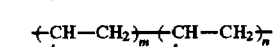
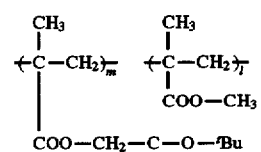 (viii)
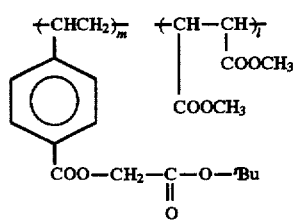 (ix)
(x)
(xi)
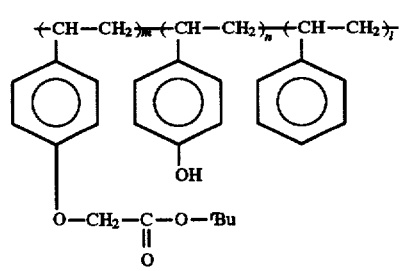 (xii)

-continued

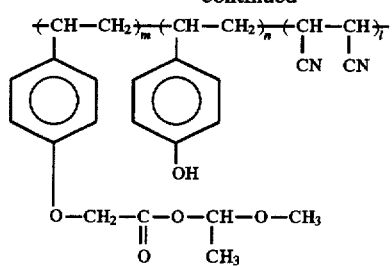 (xiii)

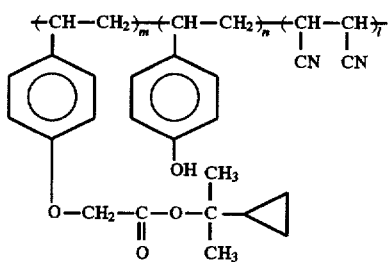 (xiv)

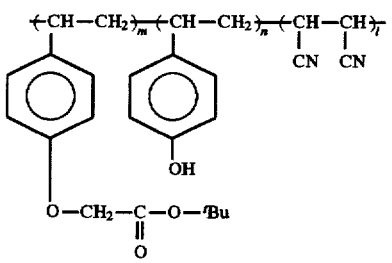 (xv)

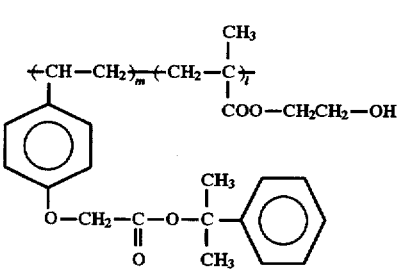 (xvi)

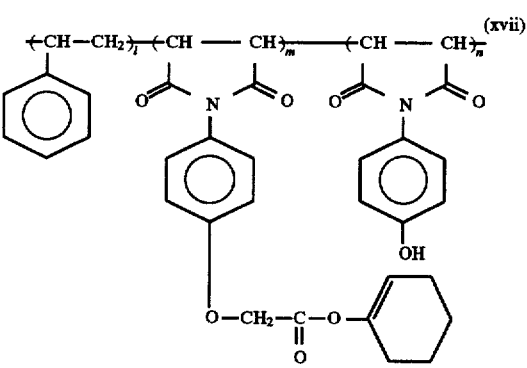 (xvii)

-continued

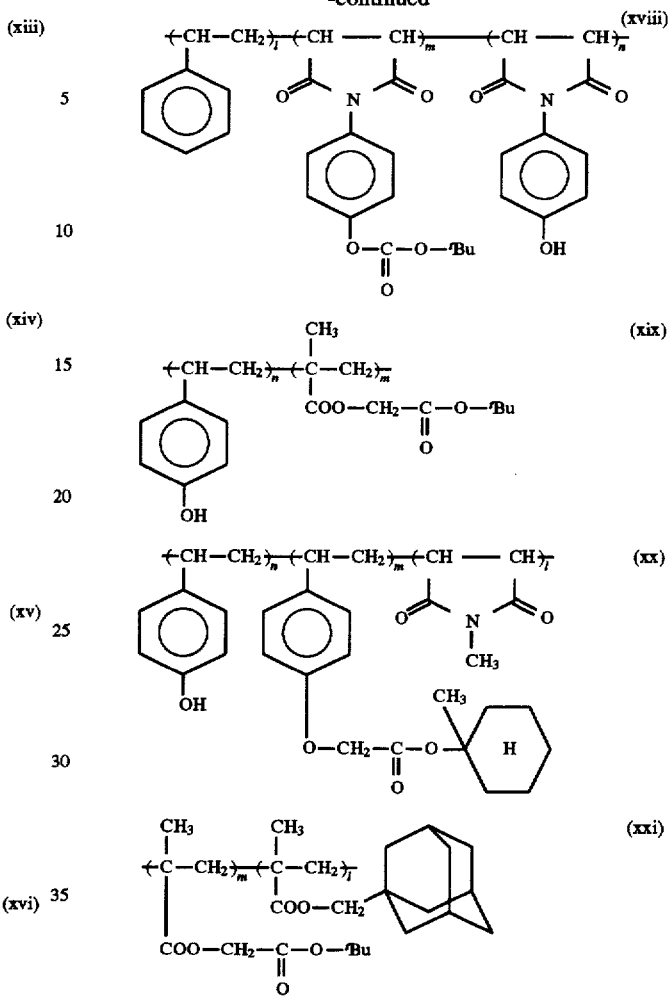

The content of the acid-decomposable group is expressed by B/(B+S), wherein B is the number of acid-decomposable groups contained in the resin, and S is the number of alkali-soluble groups not protected with an acid-decomposable group. The content is preferably from 0.01 to 0.6, more preferably from 0.05 to 0.40, still more preferably from 0.05 to 0.30. The content of the acid-decomposable group exceeding 0.6 (B/(B+S) >0.6) is not preferred because there may be caused film shrinkage after PEB or poor adhesion to or scum on the substrate, whereas the content of the acid-decomposable group below 0.01 (B/(B+S)<0.01) is not preferred because the standing wave may remain sharply on the side wall of the pattern.

The weight average molecular weight (Mw) of the acid-decomposable group-containing resin is preferably from 2,000 to 200,000. If it is less than 2,000, the film loss in the unexposed area due to development is large, whereas if it exceeds 200,000, the dissolution rate of the alkali-soluble resin by itself in alkali is retarded to lower the sensitivity. The weight average molecular weight is more preferably from 5,000 to 100,000, still more preferably from 8,000 to 50,000.

The weight average molecular weight is defined as a value calculated in terms of polystyrene in the gel permeation chromatography.

The acid-decomposable group-containing resins for use in the present invention may be used in combination of two or more thereof. The amount of the resin in the present invention is from 40 to 95% by weight, preferably from 60 to 90% by weight, based on the total weight of the photosensitive composition (excluding the solvent). Also, an alkali-soluble resin free of the acid-decomposable group may be used to adjust the alkali solubility.

Further, the compounds used as the compound (d) of the present invention may be used in combination of two or more thereof. The resist composition of the present invention using the compound (d) has a sodium content and a potassium content each of 30 ppb or less, preferably 20 ppb or less, more preferably 15 ppb or less, still more preferably 10 ppb or less.

The above-described acid-decomposable low molecular dissolution inhibitor (c) may also be used in combination. In this case, the dissolution inhibitor is used in an amount of from 1 to 45% by weight, preferably from 3 to 30% by weight, more preferably from 5 to 25% by weight, based on the total weight of the photosensitive composition excluding the solvent.

(E) Method for introducing the alkyl ester group represented by formula (I) to a low molecular compound or a resin (synthesis method for the compound (c) or (d) of the present invention)

The alkyl ester group represented by formula (I) is introduced into a low molecular compound or a resin by dissolving a compound represented by formula (II) and a low molecular compound or a resin having a phenolic hydroxyl group or a carboxyl group as described above with respect to the compounds (c) and (d) of the present invention in an appropriate solvent, adding thereto a compound represented by formula (III) and then heating the mixture. The compound represented by formula (III) acts to induce deoxidation-condensation reaction of the phenolic hydroxyl group or tie carboxyl group in the low molecular compound or in the resin with the compound represented by formula (II).

The compound represented by formula (III) for use in the method of the present invention is an ammonium hydroxide which is unsubstituted or substituted with an unsubstituted or substituted alkyl, cycloalkyl, aralkyl, alkenyl or aryl group, preferably an ammonium hydroxide substituted with at least one alkyl, cycloalkyl, aralkyl, alkenyl or aryl group. The ammonium hydroxide represented by formula (III) is preferably used in the form of a pure product free of water or alcohol as a solvent, but if desired, it may be used in a state of high concentration after reducing the water or alcohol content as much as possible by the concentration under reduced pressure. Also, an aqueous solution or an alcohol solution of the ammonium hydroxide represented by formula (III) may be used and the water or alcohol may be removed from the reaction system by heating and/or reducing the pressure.

Specific examples of the ammonium hydroxide represented by formula (III) for use in the present invention are described below, but the present invention is by no means limited thereto.

Examples of the compound represented by formula (III) include ammonium hydroxide, monomethylammonium hydroxide, dimethylammonium hydroxide, trimethylammonium hydroxide, tetramethylammonium hydroxide, tetraethylammonium hydroxide, tetrapropylammonium hydroxide, tetrabutylammonium hydroxide, butyltrimethylammonium hydroxide, hexyltrimethylammonium hydroxide, cyclohexyltrimethylammonium hydroxide, octyltrimethylammonium hydroxide, choline hydroxide, phenylmethylammonium hydroxide, phenyldimethylammonium hydroxide, phenyltrimethylammonium hydroxide, phenylmethyldiethylammonium hydroxide, 4-methoxyphenyltrimethylammonium hydroxide, allyltrimethylammonium hydroxide, diallyldimethylammonium hydroxide, benzylmethylammonium hydroxide, benzyldimethylammonium hydroxide, benzyltrimethylammonium hydroxide, benzyltriethylammonium hydroxide, benzyltributylammonium hydroxide, 4-methylbenzyltrimethylammonium hydroxide, N,N-dimethylpyrrolidinium hydroxide, N,N-dimethylpiperidinium hydroxide, N,N-dimethylperhydroazepinium hydroxide, 1,2-bis (trimethylammonium)ethane dihydroxide, 1,3-bis (trimethylammonium)cyclohexane dihydroxide, α,α'-bis (trimethylammonium) p-xylene dihydroxide and N-methylpyridinium hydroxide.

The solvent which is used in deoxidation-condensing the low molecular compound having a phenolic hydroxyl group or a carboxyl group to the compound represented by formula (II) in the presence of the compound represented by formula (III) is preferably an aprotic solvent having no active hydrogen.

Specific examples of the solvent include chloroform, carbon tetrachloride, ethylene dichloride, cyclohexane, acetone, 2-butanone, γ-butyllactone, diethylene glycol dimethyl ether, diethylene glycol monomethyl ether acetate, dimethoxyethane, 3-methoxybutyl acetate, ethylene glycol monoethyl ether acetate, ethyl 3-ethoxypropionate, 4-n-propoxy-2-butanone, 4-isobutoxy-2-butanone, 2-methoxy-2-methyl-4-pentanone, acetoxy-2-propanone, methyl acetoacetate, n-amyl acetate, isoamyl acetate, n-butyl propionate, methyl 3-methoxypropionate, n-propyl butyrate, ethyl pyruvate, ethylene glycol monomethyl ether acetate, propylene glycol monomethyl ether acetate, 2-heptanone, 3-heptanone, 4-heptanone, 4-ethoxy-2-butanone, acetylacetone, ethyl acetate, butyl acetate, benzene, toluene, xylene, chlorobenzene, nitrobenzene, tetrahydrofuran, dioxane, acetonitrile, N,N-dimethylformamide, N,N-dimethylacetamide, dimethylsulfoxide, N-methylpyrrolidone and tetramethylurea. These solvents may be used individually or in combination.

In the deoxidation-condensation reaction, the heating temperature is preferably 50° C. or higher, more preferably from 60° to 150° C., still more preferably from 70° to 130° C. In order to increase the reactivity in the deoxidation-condensation reaction, an iodide of an ammonium compound such as ammonium iodide and tetramethylammonium iodide may be added. In this case, the addition amount of the iodide is from 1/20 to 3, preferably from 1/10 to 2, still more preferably from 1/3 to 1, by mol, to the compound represented by formula (III). Also, in order to increase the reactivity, the reaction may be conducted by applying a pressure in addition to heating.

Further, in order to prevent oxidation as a side reaction in the deoxidation-condensation reaction, the reaction may be conducted under a nitrogen atmosphere or under a nitrogen stream.

The resist composition of the present invention may further contain, if desired, a dyestuff, a pigment, a plasticizer, a surfactant, a photosensitizer, a compound having two or more phenolic OH groups and capable of accelerating the solubility in a developer, or an additive for preventing the deterioration of an image by aging from exposure to post-exposure baking.

The suitable dyestuff includes an oily dyestuff and a basic dyestuff. Specific examples thereof include Oil Yellow #101, Oil Yellow #103, Oil Pink #312, Oil Green BG, Oil Blue BOS, Oil Blue #603, Oil Black BY, Oil Black BS, Oil Black T-505 (all produced by Orient Kagaku Kogyo KK), Crystal Violet (CI42555), Methyl Violet (CI42535), Rhodamine B (CI45170B), Malachite Green (CI42000) and Methylene Blue (CI52015).

Further, the resist composition of the present invention may be rendered to have sensitivity to i- or g-light by adding a spectral sensitizer as described below to effect sensitization in the wavelength region longer than the far ultraviolet region where the photo acid generator used has no absorption. Suitable and specific examples of the spectral sensitizer include benzophenone, p,p'-tetramethyldiaminobenzophenone, p,p'-tetraethylethylaminobenzophenone, 2-chlorothioxanthone, anthrone, 9-ethoxyanthracene, anthracene, pyrene, perylene, phenothiazine, benzyl, acridine orange, benzoflavin, cetoflavin-T, 9,10-diphenylanthracene, 9-fluorenone, acetophenone, phenanthrene, 2-nitrofluorene, 5-nitroacenaphthene, benzoquinone, 2-chloro-4-nitroaniline, N-acetyl-p-nitroaniline, p-nitroaniline, N-acetyl-4-nitro-1-naphthylamine, picramide, anthraquinone, 2-ethylanthraquinone, 2-tert-butylanthraquinone, 1,2-benzanthraquinone, 3-methyl-1,3-diaza-1,9-benzanthrone, dibenzalacetone, 1,2-naphthoquinone, 3,3'-carbonyl-bis(5,7-dimethoxycarbonylcoumarin) and coronene, but the present invention is by no means limited to these.

The chemically amplified-type positive resist has a defect in that it may cause decrease in the sensitivity, give a T-top shaped profile, or cause fluctuation in the line width with the lapse of time from exposure to post-exposure baking. In order to overcome these problems, a compound containing a basic nitrogen atom, a clathrate compound or a compound containing a ketal or acetal group as described in JP-A-63-149640, JP-A-5-165219, JP-A-5-173333, JP-A-5-232706, JP-A-5-249662, JP-A-5-127369, JP-A-5-289340, JP-A-6-43650, JP-A-6-266110, JP-A-6-266111 and WO-94/1805 may be added. As long as the object of the addition is satisfied, the compound to be added is of course not limited to the above-described compounds.

Specific examples of the compound containing a basic nitrogen atom include ammonia, triethylamine, tripropylamine, tributylamine, aniline, N-methylaniline, N,N-dimethylaniline, 2-methylaniline, 3-methylaniline, 4-methylaniline, 4-nitroaniline, 3,4'-diaminophenyl ether, 4,4'-diaminophenyl ether, 1-naphthylamine, 2-naphthylamine, diphenylamine, ethylenediamine, tetramethylenediamine, hexamethylenediamine, pyrrolidine, piperidine, imidazole, 4-methylimidazole, 4-methyl-2-phenylimidazole, thiabendazole, pyridine, 2-methylpyridine, 4-dimethylaminopyridine, 4-ethylpyridine, 1-methyl-4-phenylpyridine, 2-(1-ethylpropyl)pyridine, 2-hyroxypyridine, 3-hydroxypyridine, 4-hydroxypyridine, niconic acid amide, dibenzoylthiamine, riboflavin tetralactate, dimethyl succinate-1-(2-hyroxyethyl) -4-hydroxy-2,2,6,6-tetramethylpiperidine polycondensate, poly{[6-(1,1,3,3-tetramethylbutyl)imino-1,3,5-triazine-2,4-diyl][(1,2,6,6-tetramethyl-4-piperidyl)imino] hexamethylene[( 2,2,6,6-tetramethyl-4-piperidyl)imino]},2-(3,5-di-t-butyl-4-hydroxybenzyl)-2-n-butylmalonic acid bis (1,2,2,6,6-pentamethyl-4-piperidyl), 4,4'-diaminodiphenylmethane, 4,4'-diaminodiphenyl ether, 3,4'-diaminodiphenyl ether, 4,4'-diaminobenzophenone, 4,4'-diaminodiphenylamine, 2,2-bis(4-aminophenyl)propane, 2-(3-aminophenyl)-2-(4-aminophenyl)-propane, 2-(4-aminophenyl)-2-(3-hydroxyphenyl)propane, 2-(4-aminophenyl)-2-(4-hydroxyphenyl)propane, 1,4-bis[1-(4-aminophenyl)-1-methylethyl]benzene,1,3-bis[1-(4-aminophenyl)-1-methylethyl]benzene, 2-aminobenzoic acid, 3-aminobenzoic acid, 4-aminobenzoic acid, 3-dimethylaminobenzoic acid, 4-dimethylaminobenzoic acid, methyl 3-aminobenzoate, ethyl 3-aminobenzoate, methyl 4-aminobenzoate, ethyl 3-aminobenzoate, methyl 3-dimethylaminobenzoate, ethyl 3-dimethylaminobenzoate, methyl 4-dimethylaminobenzoate, ethyl 4-dimethylaminobenzoate, glycine, alanine, phenylalanine and tryptophan, but the present invention is by no means limited to these.

Examples of the clathrate compound include 2,6-di-o-methyl-α-cyclodextrin, 2,6-di-o-methyl-β-cyclodextrin, 2,6-di-o-methyl-γ-cyclodextrin, 2,6-di-o-methyl-δ-cyclodextrin, 2,6-di-o-ethyl-α-cyclodextrin, 2,6-di-o-ethyl-β-cyclodextrin, 2,6-di-n-butyl-β-cyclodextrin, 2,3,6-tri-o-methyl-β-cyclo-dextrin, 2,3,6-tri-o-methyl-β-cyclodextrin, 2,3,6-tri-o-methyl-γ-cyclodextrin, 2,3,6-tri-o-ethyl-β-cyclodextrin, o-carboxy-methyl-o-methyl-α-cyclodextrin, o-carboxymethyl-o-methyl-β-cyclodextrin, o-carboxymethyl-o-methyl-γ-cyclodextrin, o-carboxyethyl-o-methyl-β-cyclodextrin, o-carboxymethyl-o-n-butyl-cyclodextrin, o-ethoxycarbonylmethyl-o-ethyl-β-cyclodextrin, o-carboxymethyl-o-ethyl-α-cyclodextrin, o-carboxymethyl-o-ethyl-β-cyclodextrin, o-carboxymethyl-o-ethyl-γ-cyclodextrin, o-carboxymethyl-α-cyclodextrin, o-carboxy-methyl-β-cyclodextrin, o-carboxyethyl-β-cyclodextrin, o-(2,2-dimethoxy)ethyl-β-cyclodextrin, o-(2-methoxy)ethyl-β-cyclodextrin and o-methoxymethyl-β-cyclodextrin, but the present invention is by no means limited to these.

Specific examples of the compound containing a ketal or acetal group include 1,4-di-o-tosyl-2,3-o-isopropylidene-L-threitol, oligoacetal, diacetone-D-glucose, 3-o-acetyl-6-o-benzoyl-5-o-(methylsulfonyl)-1,2-o-isopropylidene-α-D-glucofuranose, 1,2,3,4-di-o-isopropylidene-6-o-(trisulfonyl)-α-D-galactopyranose, 1,2,5,6-di-o-isopropylidene-3-o-(paratolylsulfonyl)-α-D-allofuranose, 1,2-o-isopropylidene-6-o-(paratolylsulfonyl)-β-L-idofuranose and 2,2'-dimethyl-1,3-dioxorane-4-methanol, but the present invention is by no means limited to these.

In order to accelerate the dissolution in a developer, a polyhydroxy compound having two or more phenolic OH groups may be added. Preferred examples of the polyhydroxy compound include phenols, resorcinol, phloroglucin, 2,3,4-trihydroxybenzophenone, 2,3,4,4'-tetrahydroxybenzophenone, 2,3,4,3',4',5'-hexahydroxybenzophenone, acetone-pyrogallol condensed resin, phloroglucide, 2,4,2',4'-biphenyltetrol, 4,4'-thiobis(1,3-dihydroxy)benzene, 2,2',4,4'-tetrahydroxydiphenyl ether, 2,2',4,4'-tetrahydroxydiphenyl sulfoxide, 2,2',4,4'-tetrahydroxydiphenylsulfone, tris(4-hydroxyphenyl)methane, 1,1-bis(4-hydroxyphenyl)cyclohexane, 4,4'-(α-methylbenzylidene)-bisphenol, α,α',α''-tris(4-hydroxyphenyl)-1,3,5-triisopropylbenzene, α,α',α''-tris(4-hydroxyphenyl)-1-ethyl-4-isopropylbenzene, 1,2,2-tris (hydroxyphenyl)propane, 1,1,2-tris(3,5-dimethyl-4-hydroxyphenyl)propane,2,2,5,5-tetrakis(4-hydroxyphenyl) hexane, 1,2-tetrakis(4-hydroxyphenyl)ethane, 1,1,3-tris (hydroxyphenyl)butane and para[α,α,α',α'-tetrakis(4-hydroxyphenyl)]xylene.

The above-described polyhydroxy compound is added in an amount of usually 70 parts by weight or less, preferably 50 parts by weight or less, more preferably 30 parts by weight or less, per 100 parts by weight of the solid content of the composition of the present invention.

Examples of the solvent for dissolving the resist composition of the present invention include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol methyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanate, methyl 3-methoxypropionate, ethyl 3-methoxypropionate, ethyl 3-ethoxypropionate, methyl 3-ethoxypropionate, methyl pyruvate, ethyl pyruvate, ethyl acetate and butyl acetate. These organic solvents may be used individually or in combination of two or more thereof.

Further, a high boiling point solvent such as N-methylformamide, N,N-dimethylformamide, N-methylacetamide, N,N-dimethylacetamide, N-methylpyrrolidone, dimethylsulfoxide or benzyl ethyl ether may be used in combination.

A surfactant may be added into the resist composition of the present invention for further improvement in the coatability such as striation.

Examples of the surfactant include a nonionic surfactant such as polyoxyethylene alkyl ethers (e.g., polyoxyethylene lauryl ether, polyoxyethylenestearyl ether, polyoxyethylene cetyl ether and polyoxyethylene oleyl ether), polyoxyethylene alkylaryl ethers (e.g., polyoxyethylene octyl phenol ether and polyoxyethylene nonyl phenol ether), polyoxyethylene-polyoxypropylene block copolymers, sorbitan fatty acid esters (e.g., sorbitan monolaurylate, sorbitan monopalmitate, sorbitan monostearate, sorbitan monooleate, sorbitan trioleate and sorbitan tristearate), and polyoxyethylene sorbitan fatty acid esters (e.g., polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate); a fluorine-based surfactant such as Eftop EF301, EF303 and EF352 (produced by Shin Akita Kasei KK), Megafac F171 and F173 (produced by Dai-Nippon Ink & Chemicals, Inc.), Florade FC403 and FC431 (produced by Sumitomo 3M KK), ASAHIGUARD AG710, SURFLON S-382, SC101, SC102, SC103, SC104, SC105 and SC106 (produced by Asahi Glass KK); organosiloxane polymer KP341 (produced by Shin-Etsu Chemical KK); and acrylic or methacrylic (co)polymer POLYFLO No. 75 and No. 95 (produced by Kyoei Sha Yushi Kagaku Kogyo KK). Among them, a fluorine-based surfactant and a silicon-based surfactant are particularly preferred. The surfactant is added in an amount of usually 2 parts by weight or less, preferably 1 part by weight or less, per 100 parts by weight of the solid content in the composition of the present invention.

These surfactants may be added individually or in combination of several kinds thereof.

The developer for the resist composition of the present invention may be an aqueous solution of an alkali such as an inorganic alkali, e.g., sodium hydroxide, potassium hydroxide, sodium carbonate, sodium silicate, sodium metasilicate or aqueous ammonia, a primary amine, e.g., ethylamine or n-propylamine, a secondary amine, e.g., diethylamine or di-n-butylamine, a tertiary amine, e.g., triethylamine or methyldiethylamine, an alcoholamine, e.g., dimethylethanolamine or triethanolamine, a quaternary ammonium salt, e.g., tetramethylammonium hydroxide, tetraethylammonium hydroxide or choline, or a cyclic amine, e.g., pyrrole or piperidine. The concentration of the alkali is in terms of normality of from 0.001 to 1N, preferably from 0.01 to 0.5N, more preferably from 0.05 to 0.3N. The above-described aqueous alkali solution may contain an appropriate amount of alcohol such as isopropyl alcohol or a nonionic surfactant.

Among these developers, preferred is an aqueous solution of a quaternary ammonium salt and more preferred is an aqueous solution of tetramethylammonium hydroxide or choline.

The resist composition of the present invention may contain, if desired, an absorbent, a crosslinking agent or an adhesion aid. The absorbent is added, if desired, to prevent halation from the substrate or to increase visibility when the composition is coated on a transparent substrate. Suitable examples of the absorbent include commercially available absorbents described in *Kogyo-yo Shikiso no Gijutu no Shijo* (CMC Shuppan) and *Senryo Binran* (edited by Yuki Gosei Kagaku Kyokai), such as C.I. Disperse Yellow 1, 3, 4, 5, 7, 8, 13, 23, 31, 49, 50, 51, 54, 56, 60, 64, 66, 68, 79, 82, 88, 90, 93, 102, 114 and 124, C.I. Disperse Orange 1, 5, 13, 25, 29, 30, 31, 44, 57, 72 and 73, C.I. Disperse Red 1, 5, 7, 13, 17, 19, 43, 50, 54, 58, 65, 72, 78, 88, 117, 137, 143, 199 and 210, C.I. Disperse Violet 43, C.I. Disperse Blue 96, C.I. Fluorescent Brightening Agent 112, 135 and 163, C.I. Solvent Yellow 14, 16, 33 and 56, C.I. Solvent Orange 2 and 45, C.I. Solvent Red 1, 3, 8, 23, 24, 25, 27 and 49, C.I. Pigment Green 10 and C.I. Pigment Brown 2. The absorbent is usually compounded in an amount of 50 parts by weight or less, preferably 30 parts by weight or less, more preferably 10 parts by weight or less, per 100 parts by weight of the solid content in the composition of the present invention.

The crosslinking agent is added in an amount that does not affect the formation of a positive image. The crosslinking agent is added mainly to adjust the sensitivity, to increase heat durability and to improve dry etching resistance.

Examples of the crosslinking agent include a compound resulting from reaction of formaldehyde with melamine, benzoguanamine or glycoluril or an alkyl-modified product thereof, an epoxy compound, an aldehyde, an azide compound, an organic peroxide and hexamethylenetetramine. The crosslinking agent is added in an amount of less than 10 parts by weight, preferably less than 5 parts by weight, per 100 parts by weight of the solid content in the composition of the present invention. If the addition amount of the crosslinking agent exceeds 10 parts by weight, the sensitivity is reduced thereby causing scum (resist residue), thus not preferred.

The adhesion aid is added mainly to improve the adhesion between the substrate and the resist, particularly to prevent peeling of the resist in the etching process. Specific examples of the adhesion aid include chlorosilanes such as trimethylchlorosilane, dimethylvinylchlorosilane, methyldiphenylchlorosilane and chloromethyldimethylchlorosilane; alkoxysilanes such as trimethylmethoxysilane, dimethyldiethoxysilane, methyldimethoxysilane, dimethylvinylethoxysilane, diphenyldimethoxysilane and phenyltriethoxysilane; silazanes such as hexamethyldisilazane, N,N'-bis(trimethylsilyl)urea, dimethyltrimethylsilylamine and trimethylsilylimidazole; silanes such as vinyl trichlorosilane, γ-chloropropyltrimethoxysilane, γ-aminopropyltriethoxysilane and γ-glycidoxypropyltrimethoxysilane; heterocyclic compounds such as benzotriazole, benzoimidazole, indazole, imidazole, 2-mercaptobenzimidazole, 2-mercaptobenzthiazole, 2-mercaptobenzoxazole, urazole, thiouracil, mercaptoimidazole and mercaptopyrimidine; and ureas such as 1,1-dimethylurea and 1,3-dimethylurea and thiourea compounds.

The adhesion aid is added in an amount of usually less than 5 parts by weight, preferably less than 3 parts by weight, per 100 parts by weight of the solid content of the composition of the present invention.

The above-described resist composition is coated on a substrate as used in producing a precision integrated circuit element (e.g., silicon/silicon dioxide-covered substrate, glass substrate and transparent substrate such as ITO substrate) by an appropriate coating method such as spinner or coater, prebaked, exposed to light through a predetermined mask, post-heated (PEB: post exposure bake) when desired, developed, rinsed and dried to obtain a good resist.

The present invention will be described below in greater detail by referring to the examples, but the present invention should not be construed as being limited thereto. Unless otherwise indicated, the % indicates % by weight (wt %).

EXAMPLE

Synthesis Example 1 for Low Molecular Acid-Decomposable Dissolution Inhibitor

To 19.2 g (0.040 mol) of α,α',α"-tris(4-hydroxyphenyl)-1,3,5-triisopropylbenzene dissolved in 120 ml of N,N-dimethylacetamide, 23.8 g (0.13 mol) of tetramethylammonium hydroxide pentahydrate and further 23.4 g (0.12 mol) of t-butyl bromoacetate were added and stirred at 120° C. for 7 hours. Thereafter, the reaction mixture was poured into 1.5 l of ion exchange water and extracted with ethyl acetate. The ethyl acetate solution was concentrated and dried to solidify under reduced pressure to obtain 29 g of light yellow viscous solid. The solid was confirmed by NMR as Compound (31) (the R groups are all —CH$_2$—COO—C$_4$H$_9{}^t$ group) (Dissolution Inhibitor (a)).

Synthesis Example 2 for Low Molecular Acid-Decomposable Dissolution Inhibitor

To 14.3 g (0.020 mol) of α,α,α',α',α",α"-hexakis(4-hydroxyphenyl)-1,3,5-triethylbenzene dissolved in 120 ml of N,N-dimethylacetamide, 23.8 g (0.13 mol) of tetramethylammonium hydroxide pentahydrate and further 23.4 g (0.12 mol) of t-butyl bromoacetate were added and stirred at 120° C. for 7 hours. Thereafter, the reaction mixture was poured in 1.5 l of ion exchange water and extracted with ethyl acetate. The ethyl acetate solution was concentrated and dried to solidify under reduced pressure to obtain 22 g of light yellow powder. The powder was confirmed by NMR as Compound (62) (the R groups are all —CH$_2$—COO—C$_4$H$_9{}^t$ group) (Dissolution Inhibitor (b)).

Synthesis Example 3 for Low Molecular Acid-Decomposable Dissolution Inhibitor 48.1 g (0.10 mol) of α,α',α"-tris(4-hydroxyphenyl)-1,3,5-isotripropylbenzene was dissolved in 300 ml of N,N-dimethylacetamide and thereto 39.9 g (0.22 mol) of tetramethylammonium hydroxide pentahydrate and 39.0 g (0.20 mol) of t-butyl bromoacetate were added and then stirred at 120° C. for 5 hours. The mixture was neutralized by adding 13.2 g of acetic acid and then the reaction mixture was poured into 2 l of ion exchange water and extracted with ethyl acetate.

The ethyl acetate extract was concentrated to obtain 69 g of Dissolution Inhibitor (c) having the following structure.

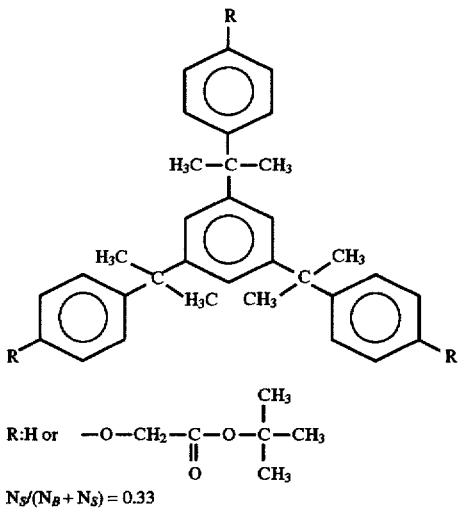

R:H or —O—CH$_2$—C(=O)—O—C(CH$_3$)$_3$

N$_S$/(N$_B$+N$_S$) = 0.33

Synthesis Example 4 for Low Molecular Acid-Decomposable Dissolution Inhibitor 54.4 g (0.13 mol) of a 40% methanol solution of benzyltrimethylammonium hydroxide was concentrated, dried to solidify and then dissolved in 200 ml of toluene. 13.2 g (0.030 mol) of 1,3,3,5-tetrakis(4-hydroxyphenyl)pentane and 23.4 g (0.12 mol) of t-butyl bromoacetate were added thereto and heated under reflux for 8 hours. The reaction mixture was washed with ion exchange water and the liquid part was separated, concentrated and dried to solidify to obtain 25 g of light yellow powder. The powder was confirmed by NMR as Compound (60) (the R groups are all —CH$_2$—COO—C$_4$H$_9{}^t$ group) (Dissolution Inhibitor (d)).

Synthesis Example 5 of Low Molecular Acid-Decomposable Dissolution Inhibitor 47.4 g (0.13 mol) of a 25% aqueous solution of tetramethylammonium hydroxide was dissolved in 200 ml of N,N-dimethylacetamide and thereto 17.6 g (0.030 mol) of α,α,α',α'-tetrakis(2,5-dimethyl-4-hydroxyphenyl)-p-xylene and 23.4 g (0.12 mol) of t-butyl bromoacetate were added. After distilling off water from the reaction solution under reduced pressure, the solution was stirred at 120° C. for 5 hours. Thereafter, the reaction mixture was poured into 1.5 l of ion exchange water and extracted with ethyl acetate. The ethyl acetate solution was concentrated and dried to solidify under reduced pressure to obtain 28 g of light yellow powder. The powder was confirmed by NMR as Compound (20) (the R groups are all —CH$_2$—COO—C$_4$H$_9{}^t$ group) (Dissolution Inhibitor (e)).

Synthesis Example 6 for Low Molecular Acid-Decomposable Dissolution Inhibitor 32.3 g (0.12 mol) of a 45% methanol solution of choline hydroxide was concentrated, dried to solidify and then dissolved in 200 ml of acetone. Thereafter, 17.0 g (0.040 mol) of α,α',α'-tris(4-hydroxyphenyl)-α,α,α'-trimethyl-p-xylene, 28.2 g (0.12 mol) of 1-methyl-1-cyclohexyl bromoacetate and 17.4 g (0.12 mol) of ammonium iodide were added thereto and heated under reflux for 8 hours. The reaction mixture was poured into 1 l of ion exchange water and the precipitated viscous solid was collected and dried under reduced pressure to obtain 31 g of light yellow powder. The powder was confirmed by NMR as Compound (18) (the R groups are all the same group as the acid-decomposable group shown in Synthesis Example 8 of Table 1) (Dissolution Inhibitor (f)).

Synthesis Examples 7 to 12 for Low Molecular Acid-Decomposable Dissolution Inhibitor Dissolution Inhibitors (g) to (l) of the present invention were synthesized in the same manner as in Synthesis Examples 1 to 6. The structure of each dissolution inhibitor, the acid-decomposable group, the ammonium hydroxide used and the $N_S/(N_B+N_S)$ value are shown in Table 1.

formed was dried under reduced pressure to obtain 28 g of light brown resin. The resin was confirmed by NMR as a resin of formula (iv) substituted by 20 mol % of —$CH_2$—COO—$C_4H_9^t$.

TABLE 1

(Synthesis of Dissolution Inhibitor)

| Synthesis Example | Dissolution Inhibitor | Structure (formula No.) | Acid-Decomposable Group | Compound of Formula (III) used | $N_S/(N_B + N_S)$ |
|---|---|---|---|---|---|
| 7 | g | 7 | —$CH_2$—COO—$C_4H_9^t$ | tetramethylammonium hydroxide | 0.33 |
| 8 | h | 15 | —$CH_2$—COO—(CH$_3$)H-phenyl | tetramethylammonium hydroxide | 0 |
| 9 | i | 16 | —$CH_2$—COO—C(CH$_3$)$_2$-phenyl | benzyltrimethyl-ammonium hydroxide | 0 |
| 10 | j | 36 | —$CH_2$—COO—$C_4H_9^t$ | phenyltrimethyl-ammonium hydroxide | 0 |
| 11 | k | 41 | —$CH_2$—COO—$C_4H_9^t$ | tetrabutylammonium hydroxide | 0.25 |
| 12 | l | 42 | —$CH_2$—COO—(CH$_3$)H-phenyl | tetramethylammonium hydroxide | 0.25 |

Synthesis Example 13 for Acid-Decomposable Group-containing Resin

To 24.0 g of poly(4-hydroxystyrene) (weight average molecular weight: 25,000) dissolved in 200 ml of N,N-dimethylformamide, 10.9 g (0.060 mol) of tetramethylammonium hydroxide pentahydrate and further 11.7 g (0.060 mol) of t-butyl bromoacetate were added and stirred at 120° C. for 7 hours. Thereafter, the reaction mixture was poured into 2 l of ion exchange water and precipitates thus formed was dried under reduced pressure to obtain 27 g of white resin. The resin was confirmed by NMR as a resin of formula (iii) substituted by 30 mol % of —$CH_2$—COO—$C_4H_9^t$.

Synthesis Example 14 for Acid-Decomposable Group-containing Resin 14.6 g (0.040 mol) of a 25% aqueous solution of tetramethylammonium hydroxide was dissolved in 200 ml of N,N-dimethylformamide and thereto 26.8 g of poly(3-methyl-4-hydroxystyrene) (weight average molecular weight: 22,000) and 7.8 g (0.040 mol) of t-butyl bromoacetate were added. After distilling off water from the reaction solution under reduced pressure, the solution was stirred at 120° C. for 5 hours. Thereafter, the reaction mixture was poured into 2 l of ion exchange water and precipitates thus Synthesis Example 15 of Acid-Decomposable Group-containing Resin 16.7 g (0.040 mol) of a 40% methanol solution of benzyltrimethylammonium hydroxide was concentrated, dried to solidify and then dissolved in 200 ml of acetone. Thereafter, 23.6 g of a 4-hydroxystyrene/styrene=85/15 (by mol) copolymer (weight average molecular weight: 32,000), 7.8 g (0.040 mol) of t-butyl bromoacetate and 8.0 g (0.040 mol) of tetramethylammonium iodide were added thereto and heated under reflux for 8 hours. The reaction mixture was poured into 2 l of ion exchange water and precipitates thus formed was dried under reduced pressure to obtain 26 g of white resin. The resin was confirmed as a resin of formula (xii) substituted by 20 mol % of —$CH_2$—COO—$C_4H_9^t$.

Synthesis Examples 16 to 20 for Acid-Decomposable Group-containing Resin

Acid decomposable group-containing resins were synthesized in the same manner as in Synthesis Examples 13 to 15. The structure of each resin, the ammonium hydroxide used and the substitution rate of the acid decomposable group are shown in Table 2.

TABLE 2

(Synthesis of Acid-Decomposable Group-containing Resin)

| Synthesis Example | Acid-Decomposable Group-containing Resin (formula No.) | Weight Average Molecular Weight of Base Polymer | Compound of Formula (III) used | Substitution Rate of Acid-Decomposable Group (mol %) |
|---|---|---|---|---|
| 16 | (ii) | 25,000 | tetramethylammonium hydroxide | 40 |
| 17 | (v) | 23,000 | benzyltrimethylammonium hydroxide | 20 |
| 18 | (xv) | 12,000 | phenyltrimethylammonium hydroxide | 30 |
| 19 | (xx) | 16,000 | tetramethylammonium hydroxide | 20 |
| 20 | (xxi) | 38,000 | tetramethylammonium hydroxide | 60 |

In Table 2, the content of 1 moiety in Compound (v), (xv) or (xx) was 20 mol % while the content in Compound (xxi) was 40 mol %.

Comparative Synthesis Example 1 for Comparative Dissolution Inhibitor

The reaction and the subsequent process were conducted thoroughly in the same manner as in Synthesis Example 1 except for using 18.0 g (0.13 mol) of potassium carbonate in place of tetramethylammonium hydroxide pentahydrate in Synthesis Example 1 of the present invention. As a result, 29 g of light yellow viscous solid was obtained and the solid was confirmed by NMR as the same compound as obtained in Synthesis Example 1 (Comparative Dissolution Inhibitor (m)).

Comparative Synthesis Example 2 for Comparative Dissolution-Inhibitor

The reaction and the subsequent process were conducted thoroughly in the same manner as in Synthesis Example 3 except for using 23.3 g (0.22 mol) of sodium carbonate in place of tetramethylammonium hydroxide pentahydrate in Synthesis Example 3 of the present invention. As a result, 69 g of the same compound as obtained in Synthesis Example 3 was obtained (Comparative Dissolution Inhibitor (n)).

Comparative Synthesis Example 3 for Comparative Dissolution Inhibitor

The reaction and the subsequent process were conducted thoroughly in the same manner as in Synthesis Example 6 except for using 16.6 g (0.12 mol) of potassium carbonate in place of the concentrated and dry-solidified product of a 45% methanol solution of choline hydroxide and also using 19.9 g (0.12 mol) of potassium iodide in place of ammonium iodide in Synthesis Example 6 of the present invention. As a result, 31 g of the same compound as obtained in Synthesis Example 6 was obtained (Comparative Dissolution Inhibitor (o)).

Comparative Synthesis Example 4 for Comparative Acid-Decomposable Group-containing Resin The reaction and the subsequent process were conducted thoroughly in the same manner as in Synthesis Example 13 except for using 8.3 g (0.060 mol) of potassium carbonate in place of tetramethylammonium hydroxide pentahydrate in Synthesis Example 13 of the present invention. As a result, 27 g of the same resin as obtained in Synthesis Example 13 was obtained (Comparative Resin (xxii)).

Comparative Synthesis Example 5 for Comparative Acid-Decomposable Group-containing Resin The reaction and the subsequent process were conducted thoroughly in the same manner as in Synthesis Example 15 except for using 4.2 g (0.040 mol) of sodium carbonate in place of the concentrated and dry-solidified product of a 40% methanol solution of benzyltrimethylammonium hydroxide and also using 6.0 g (0.040 mol) of sodium iodide in place of tetramethylammonium iodide in Synthesis Example 15 of the present invention. As a result, 26 g of the same resin as obtained in Synthesis Example 15 was obtained (Comparative Resin (xxiii)).

Comparative Synthesis Example 6 Using Other Organic Amine

The reaction and the subsequent process were conducted thoroughly in the same manner as in Synthesis Example 1 except for using 13.2 g (0.13 mol) of triethylamine in place of tetramethylammonium hydroxide pentahydrate in Synthesis Example 1 of the present invention. However, the deoxidation-condensation reaction did not occur between α,α',α"-tris(4-hydroxyphenyl)-1,3,5-triisopropylbenzene and t-butyl bromoacetate and only the raw materials were collected.

Comparative Synthesis Example 7 Using Other Organic Amine

The reaction and the subsequent process were conducted thoroughly in the same manner as in Synthesis Example 1 except for using 19.8 g (0.13 mol) of DBU (1,8-diazabicyclo-[5,4,0]-7-undecene) in place of tetramethylammonium hydroxide pentahydrate in Synthesis Example 1 of the present invention. However, the deoxidation-condensation reaction did not occur similarly to Comparative Synthesis Example 6 above and only the raw materials were collected.

EXAMPLES 1 TO 20

Using each of the dissolution inhibitors and resins obtained in the above Synthesis Examples, a resist was prepared. The preparation formulations are shown in Table 3.

COMPARATIVE EXAMPLES 1 TO 5

Using each of Comparative Dissolution Inhibitor (m) to (o) and Comparative Resins (xxii) and (xxiii) obtained above Comparative Synthesis Examples, a resist for comparison was prepared. The preparation formulations are shown in Table 3.

TABLE 3

(Formulation of Resist Composition)

| | Alkali-Soluble Resin | | Photo Acid Generator (g) | | Dissolution Inhibitor (g) | |
|---|---|---|---|---|---|---|
| Example 1 | NOV.1 | 1.5 | PAG4-5 | 0.05 | a | 0.50 |
| Example 2 | NOV.2 | 1.5 | PAG4-5 | 0.05 | h | 0.50 |
| Example 3 | NOV.1 | 1.5 | PAG3-5 | 0.05 | d | 0.50 |
| Example 4 | PHS/St | 1.5 | PAG4-5 | 0.05 | c | 0.50 |
| Example 5 | PHS/St | 1.5 | PAG4-8 | 0.05 | b | 0.50 |
| Example 6 | PHS/AcSt | 1.5 | PAG4-28 | 0.05 | l | 0.50 |
| Example 7 | PHS/OHS | 1.5 | PAG5-12 | 0.05 | e | 0.50 |
| Example 8 | PHS/AcSt | 1.5 | PAG5-11 | 0.05 | j | 0.50 |
| Example 9 | PHS/St | 1.5 | PAG6-14 | 0.05 | g | 0.50 |
| Example 10 | PHS/OHS | 1.5 | PAG4-7 | 0.05 | i | 0.50 |
| Example 11 | PHS/TBOCS | 1.5 | PAG4-5 | 0.05 | f | 0.50 |
| Example 12 | (iii) | 1.5 | PAG4-5 | 0.05 | k | 0.50 |
| Example 13 | (iv) | 1.0 | PAG4-9 | 0.08 | — | |
| Example 14 | (ii) | 1.0 | PAG5-9 | 0.08 | — | |
| Example 15 | (v) | 1.0 | PAG4-5 | 0.08 | — | |
| Example 16 | (xv) | 1.0 | PAG6-15 | 0.08 | — | |
| Example 17 | (xx) | 1.0 | PAG4-5 | 0.08 | — | |
| Example 18 | (xxi) | 1.0 | PAG4-8 | 0.08 | — | |
| Example 19 | (iii) | 1.0 | PAG4-5 | 0.08 | — | |
| Example 20 | (xii) | 1.0 | PAG4-5 | 0.08 | — | |
| Comparative Example 1 | NOV.1 | 1.5 | PAG4-5 | 0.05 | m | 0.50 |
| Comparative Example 2 | PHS/St | 1.5 | PAG4-5 | 0.05 | n | 0.50 |
| Comparative Example 3 | PHS/TBOMS | 1.5 | PAG4-5 | 0.05 | o | 0.50 |
| Comparative Example 4 | (xxii) | 1.0 | PAG4-5 | 0.08 | — | |
| Comparative Example 5 | (xxiii) | 1.0 | PAG4-5 | 0.0 | — | |

The abbreviation used in Table 3 each indicate the following compound.

| Resin (the numerals in parenthesis indicate the molar ratio) | |
|---|---|
| NOV. 1: | novolak resin of m-cresol/p-cresol (50/50) and formalin; Mw = 8,700 |
| NOV. 2: | novolak resin of m-cresol/p-cresol/3,5-xylenol (60/20/20) and formalin; Mw = 5,800 |
| PHS/St: | p-hydroxystyrene/styrene (85/15) copolymer; Mw = 32,000 |
| PHS/OHS: | p-hydroxystyrene/o-hydroxystyrene (80/20) copolymer; Mw = 38,000 |
| PHS/AcSt: | p-hydroxystyrene/p-acetoxystyrene (80/20) copolymer; Mw = 26,000 |
| PHS/TBOCS: | p-hydroxystyrene/t-butoxycarbonyloxystyrene (80/20) copolymer; Mw = 21,000 |

Preparation of Resist Composition and Measurement of Metal Content 0.01 g of 4-dimethylaminopyridine was added to each composition shown in Table 3 and the resulting solution was dissolved in 9.5 g of propylene glycol monomethyl ether acetate. Thereafter, the solution was filtered through a 0.2 μm filter to prepare a resist solution. Each resist solution was measured for its sodium and potassium contents by atomic absorption. The results obtained are shown in Table 4.

TABLE 4

(Metal Content in Resist Composition)

| Example | Sodium Content (ppb) | Potassium Content (ppb) |
|---|---|---|
| 1 | 8 | 6 |
| 2 | 10 | 7 |
| 3 | 6 | 5 |
| 4 | 9 | 4 |
| 5 | 11 | 9 |
| 6 | 7 | 10 |
| 7 | 6 | 5 |
| 8 | 9 | 8 |
| 9 | 7 | 12 |
| 10 | 10 | 8 |
| 11 | 4 | 7 |
| 12 | 7 | 7 |
| 13 | 8 | 4 |
| 14 | 8 | 6 |
| 15 | 5 | 9 |
| 16 | 9 | 10 |
| 17 | 12 | 11 |
| 18 | 15 | 10 |
| 19 | 8 | 5 |
| 20 | 9 | 7 |
| Comparative Example | | |
| 1 | 52 | 320 |
| 2 | 335 | 58 |
| 3 | 65 | 375 |
| 4 | 42 | 290 |
| 5 | 310 | 48 |

Evaluation of Resist Composition

Each of the above-described resist solutions of the present invention was coated on a silicon wafer by means of a spin coater and dried on a vacuum-adsorption type hot plate at 120° C. for 60 seconds to obtain a resist film having a thickness of 1.0 μm.

The resist film was exposed using 248 nm KrF excimer laser stepper (NA=0.45). After exposure, the film was heated on a vacuum-adsorption type hot plate at 100° C. for 60 seconds and immediately dipped in an aqueous solution of 2.38% tetramethylammonium hydroxide (TMAH) for 60 seconds, rinsed with water for 30 seconds and dried. The thus obtained pattern on the silicon wafer was evaluated on the sensitivity and the resolution as described below. The results obtained are shown in Table 5.

Sensitivity

The sensitivity is defined by the exposure amount required for reproducing a mask pattern of 0.50 μm.

Resolution

The resolution indicates the critical resolution at the exposure amount required for reproducing a mask pattern of 0.50 μm.

TABLE 5

(Evaluation Results)

| | Sensitivity (mJ/cm$^2$) | Resolution (μm) |
|---|---|---|
| Example 1 | 23 | 0.32 |
| Example 2 | 22 | 0.30 |
| Example 3 | 27 | 0.30 |
| Example 4 | 18 | 0.26 |
| Example 5 | 26 | 0.28 |
| Example 6 | 18 | 0.26 |

TABLE 5-continued (Evaluation Results)

| | Sensitivity (mJ/cm$^2$) | Resolution (μm) |
|---|---|---|
| Example 7 | 32 | 0.28 |
| Example 8 | 31 | 0.30 |
| Example 9 | 24 | 0.30 |
| Example 10 | 23 | 0.30 |
| Example 11 | 28 | 0.28 |
| Example 12 | 20 | 0.26 |
| Example 13 | 45 | 0.34 |
| Example 14 | 36 | 0.38 |
| Example 15 | 46 | 0.34 |
| Example 16 | 44 | 0.38 |
| Example 17 | 47 | 0.34 |
| Example 18 | 48 | 0.38 |
| Example 19 | 42 | 0.34 |
| Example 20 | 43 | 0.34 |

From the results shown in Table 4, it is seen that the resist composition using the dissolution inhibitor or resin synthesized according to the method of the present invention is low in the sodium and potassium contents as compared with comparative compositions. Also, from the results shown in Table 5, it is seen that the composition of the present invention exhibits good sensitivity and resolution.

The resist composition using the dissolution inhibiting compound or resin synthesized according to the method of the present invention is low in the sodium and potassium contents and exhibits good sensitivity and resolution.

While the invention has been described in detail and with reference to specific embodiments thereof, it will be apparent to one skilled in the art that various changes and modifications can be made therein without departing from the spirit and scope thereof.

What is claimed is:

1. A positive chemically amplified resist composition comprising:

(a) a compound which generates an acid upon irradiation with active light or radiant ray;

(b) a resin insoluble in water but soluble in an aqueous alkali solution; and (c) a low molecular acid-decomposable dissolution inhibitor having a molecular weight of 3,000 or less and containing an acid-decomposable alkyl ester group represented by formula (I) and which increases its solubility in an alkali developer by the action of an acid:

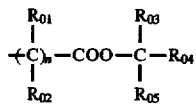

wherein $R_{01}$ and $R_{02}$ each represents a hydrogen atom, an alkyl group or an aryl group each of which may have a substituent; $R_{03}$, $R_{04}$ and $R_{05}$ each represents a hydrogen atom, an alkyl group, a cycloalkyl group, an alkoxy group, an aryl group, an alkenyl group or an aralkyl group each of which may have a substituent, provided that two of $R_{03}$, $R_{04}$ and $R_{05}$ may be combined to form a ring; and n represents an integer of from 1 to 10, wherein said compound (c) is a compound obtained by a deoxidation-condensation reaction of a low molecular compound having a phenolic hydroxyl group or a carboxyl group with a compound represented by formula (II) in the presence of an ammonium hydroxide represented by formula (III):

wherein $R_{01}$ and $R_{02}$ each represents a hydrogen atom, an alkyl group or an aryl group each of which may have a substituent; $R_{03}$, $R_{04}$ and $R_{05}$ each represents a hydrogen atom, an alkyl group, a cycloalkyl group, an alkoxy group, an aryl group, an alkenyl group or an aralkyl group each of which may have a substituent, provided that two of $R_{03}$, $R_{04}$ and $R_{05}$ may be combined to form a ring; n represents an integer of from 1 to 10; X represents a chlorine atom, a bromine atom, an iodine atom, or an oxysulfonyl group; an $R_{06}$, $R_{07}$ $R_{08}$ and $R_{09}$ each represents a hydrogen atom, an alkyl group, a cycloalkyl group, an aralkyl group, an alkenyl group, an aryl group each of which may have a substituent, provided that two of $R_{03}$, $R_{04}$ and $R_{05}$ or two of $R_{06}$, $R_{07}$, $R_{08}$ and $R_{09}$ may be combined to form a ring; and having a sodium content and a potassium content each of 30 ppb or less.

2. A positive chemical amplification resist composition comprising (a) a compound which generates an acid upon irradiation with active light or radiant ray and (d) a resin having an acid-decomposable alkyl ester group represented by formula (I), and which increases its solubility in an alkali developer by the action of an acid:

wherein $R_{01}$ and $R_{02}$ each represents a hydrogen atom, an alkyl group or an aryl group each of which may have a substituent; $R_{03}$, $R_{04}$ and $R_{05}$ each represents a hydrogen atom, an alkyl group, a cycloalkyl group, an alkoxy group, an aryl group, an alkenyl group or an aralkyl group each of which may have a substituent, provided that two of $R_{03}$, $R_{04}$ and $R_{05}$ may be combined to form a ring; and n represents an integer of from 1 to 10, wherein said resin (d) is a resin obtained by a deoxidation-condensation reaction of a resin having a phenolic hydroxyl group or a carboxyl group with a compound represented by formula (II) in the presence of an ammonium hydroxide represented by formula (III):

wherein $R_{01}$ and $R_{02}$ each represents a hydrogen atom, an alkyl group or an aryl group each of which may have a substituent; $R_{03}$, $R_{04}$ and $R_{05}$ each represents a hydrogen atom, an alkyl group, a cycloalkyl group, an alkoxy group, an aryl group, an alkenyl group or an aralkyl group each of which may have a substituent, provided that two of $R_{03}$ $R_{04}$ and $R_{05}$ may be combined to form a ring; n represents an integer of from 1 to 10; X represents a chlorine atom, a bromine atom, an iodine atom, or an oxysulfonyl group; and $R_{06}$, $R_{07}$, $R_{08}$ and $R_{09}$ each represents a hydrogen atom, an alkyl group, a cycloalkyl group, an aralkyl group, an alkenyl group or an aryl group each of which may have a substituent, provided that two of $R_{03}$, $R_{04}$ and $R_{05}$ or two of $R_{06}$, $R_{07}$, $R_{08}$ and $R_{09}$ may be combined to form a ring;

and having a sodium content and a potassium content each of 30 ppb or less.

* * * * *